United States Patent
Baek et al.

(10) Patent No.: US 12,237,385 B2
(45) Date of Patent: Feb. 25, 2025

(54) SEMICONDUCTOR DEVICES INCLUDING INSULATION PATTERNS WITH DIFFERENT CARBON CONCENTRATIONS

(71) Applicant: SAMSUNG ELECTRONICS CO., LTD., Suwon-si (KR)

(72) Inventors: Bongkwan Baek, Seoul (KR); Junghwan Chun, Anyang-si (KR); Jongmin Baek, Seoul (KR); Koungmin Ryu, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 436 days.

(21) Appl. No.: 17/712,319

(22) Filed: Apr. 4, 2022

(65) Prior Publication Data

US 2023/0036104 A1    Feb. 2, 2023

(30) Foreign Application Priority Data

Jul. 29, 2021    (KR) .................. 10-2021-0099667

(51) Int. Cl.
| | |
|---|---|
| H01L 21/02 | (2006.01) |
| H01L 21/768 | (2006.01) |
| H01L 29/06 | (2006.01) |
| H01L 29/417 | (2006.01) |
| H01L 29/423 | (2006.01) |
| H01L 29/786 | (2006.01) |

(52) U.S. Cl.
CPC .. *H01L 29/41775* (2013.01); *H01L 21/02123* (2013.01); *H01L 21/02126* (2013.01); *H01L 21/02167* (2013.01); *H01L 21/02362* (2013.01); *H01L 21/76829* (2013.01); *H01L 21/76832* (2013.01); *H01L 21/76834* (2013.01); *H01L 29/0665* (2013.01); *H01L 29/42392* (2013.01); *H01L 29/78696* (2013.01)

(58) Field of Classification Search
None
See application file for complete search history.

(56) References Cited

U.S. PATENT DOCUMENTS

| | | |
|---|---|---|
| 9,786,767 B2 | 10/2017 | Leobandung |
| 9,859,386 B2 | 1/2018 | Ho et al. |
| 10,283,406 B2 | 5/2019 | Basker et al. |
| 10,388,770 B1 | 8/2019 | Xie et al. |
| 10,943,990 B2 | 3/2021 | Greene et al. |
| 2018/0033614 A1* | 2/2018 | Chandra ............... C23C 16/308 |

(Continued)

OTHER PUBLICATIONS

Dong Ni, Yiming Lou, P. D. Christofides, L. Sha, S. Lao and J. P. Chang, "Real-time carbon content control for PECVD ZrO/sub 2/thin-film growth," in IEEE Transactions on Semiconductor Manufacturing, vol. 17, No. 2, pp. 221-230, May 2004, doi: 10.1109/TSM.2004.826939. (Year: 2004).*

*Primary Examiner* — Nicholas J Tobergte
*Assistant Examiner* — William Henry Anderson
(74) *Attorney, Agent, or Firm* — Sughrue Mion, PLLC

(57) ABSTRACT

A semiconductor device includes a gate structure disposed on a substrate; a source and drain layer disposed on the substrate adjacent the gate structure; a first contact plug disposed on the source and drain layer, an insulation pattern structure disposed on the first contact plug, the insulation pattern structure including insulation patterns having different carbon concentrations; and a second contact plug disposed on the gate structure.

18 Claims, 41 Drawing Sheets

(56) References Cited

U.S. PATENT DOCUMENTS

| | | |
|---|---|---|
| 2020/0105909 A1 | 4/2020 | Wu et al. |
| 2020/0168720 A1* | 5/2020 | Kwak ................... H10B 10/12 |
| 2021/0082770 A1* | 3/2021 | Xie ................. H01L 21/823475 |
| 2021/0098598 A1* | 4/2021 | Yang ................. H01L 21/31144 |
| 2021/0118731 A1* | 4/2021 | Chuang ............... H01L 23/5226 |
| 2021/0134969 A1* | 5/2021 | Huang .............. H01L 29/66515 |
| 2022/0013649 A1* | 1/2022 | Lee ................... H01L 29/42392 |
| 2022/0139914 A1* | 5/2022 | Cheng ............. H01L 21/823431 |
| | | 257/288 |

* cited by examiner

FIG. 1
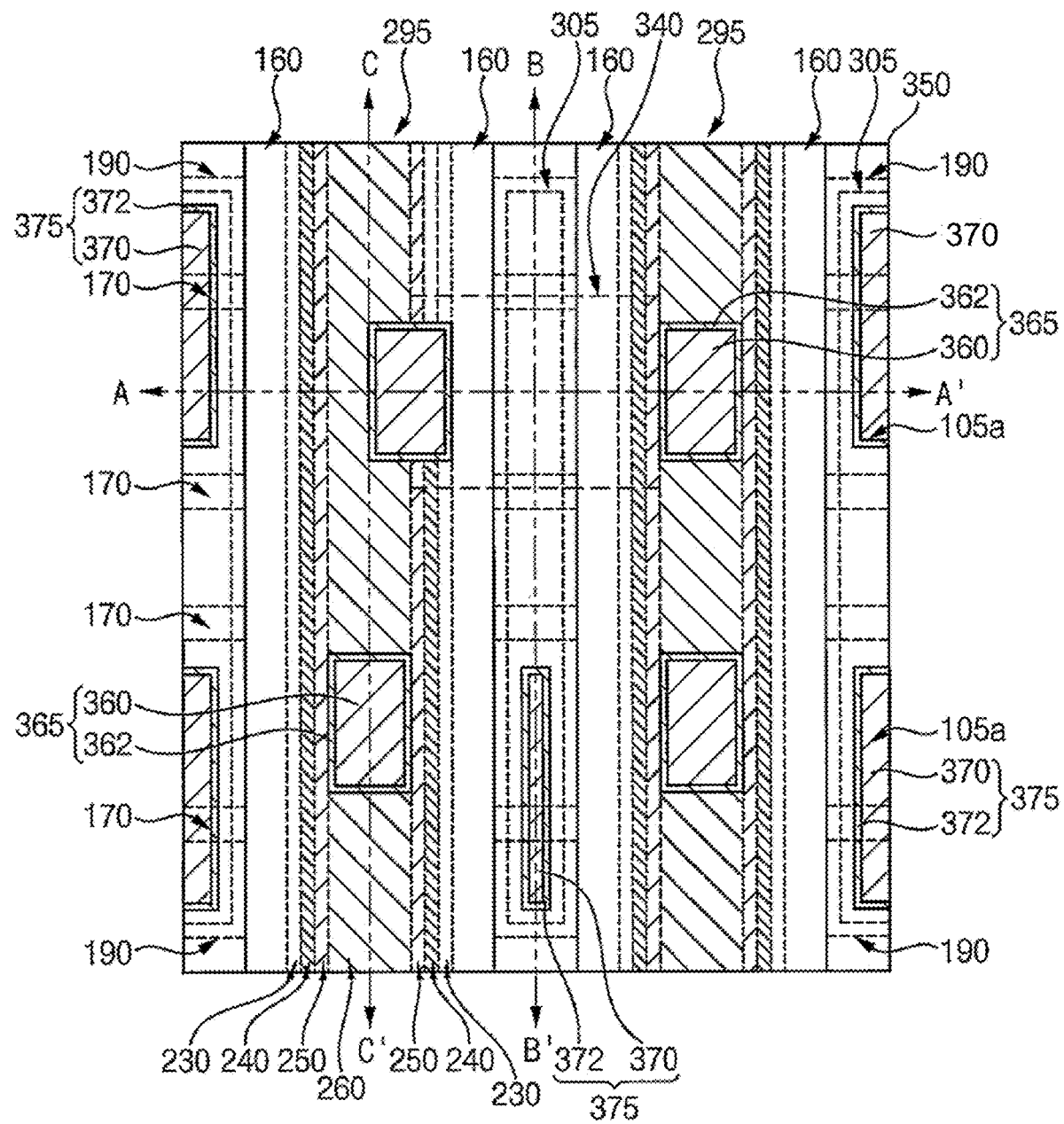
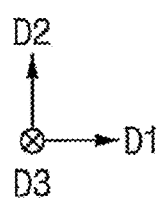

FIG. 13
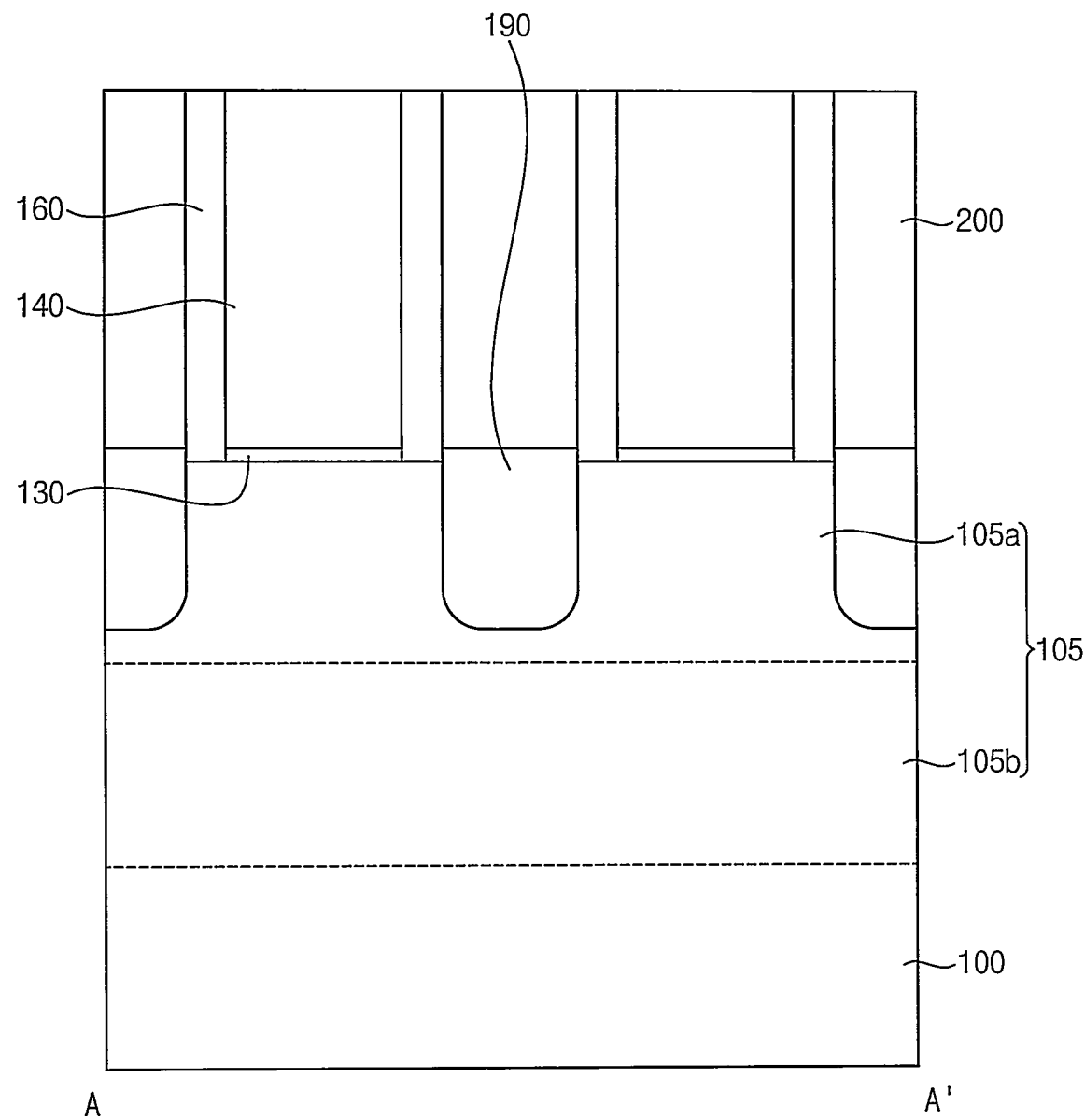
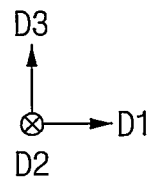

FIG. 20
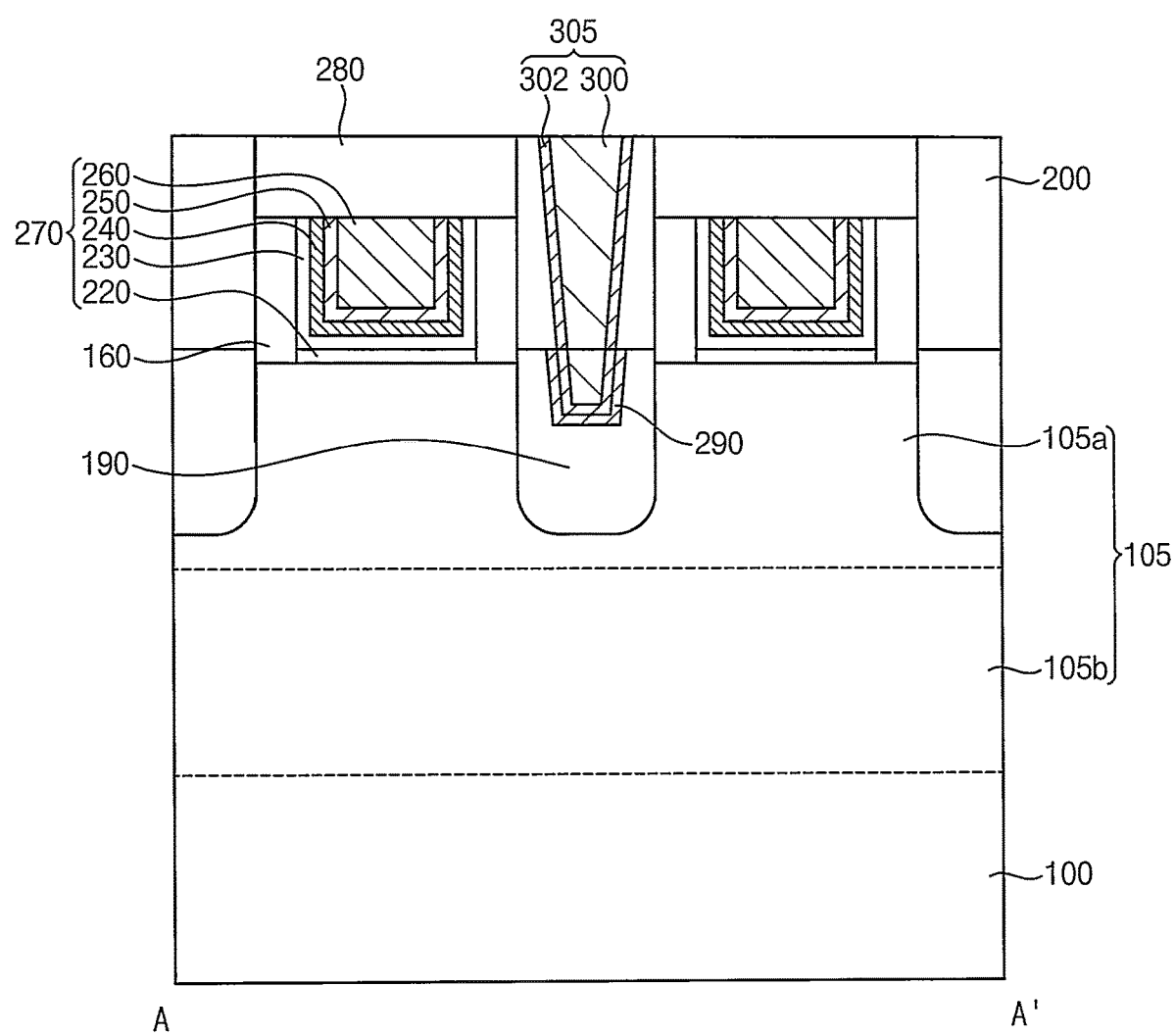
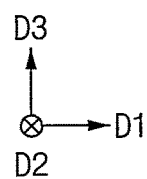

FIG. 26
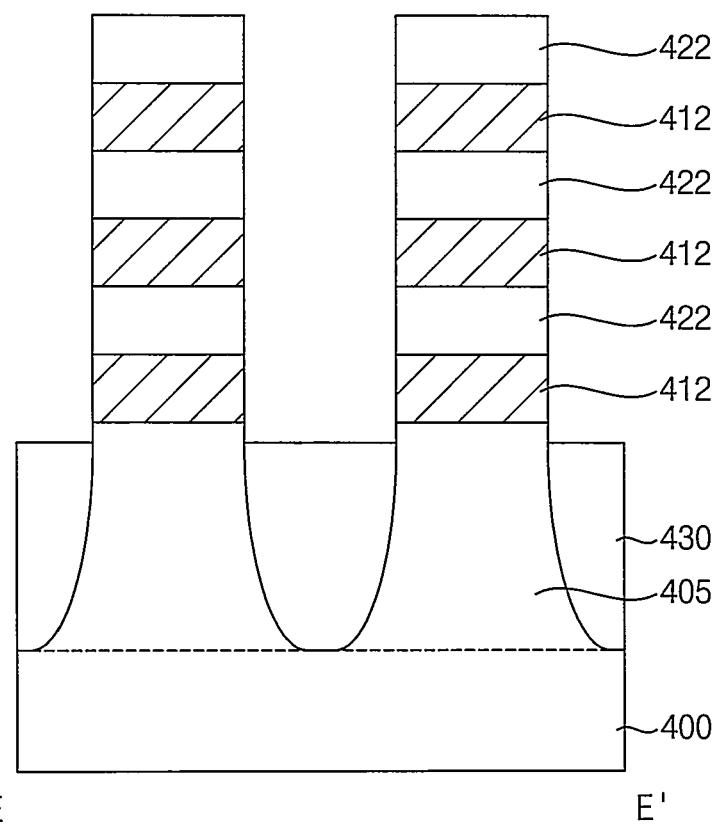
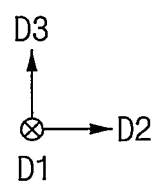

FIG. 28
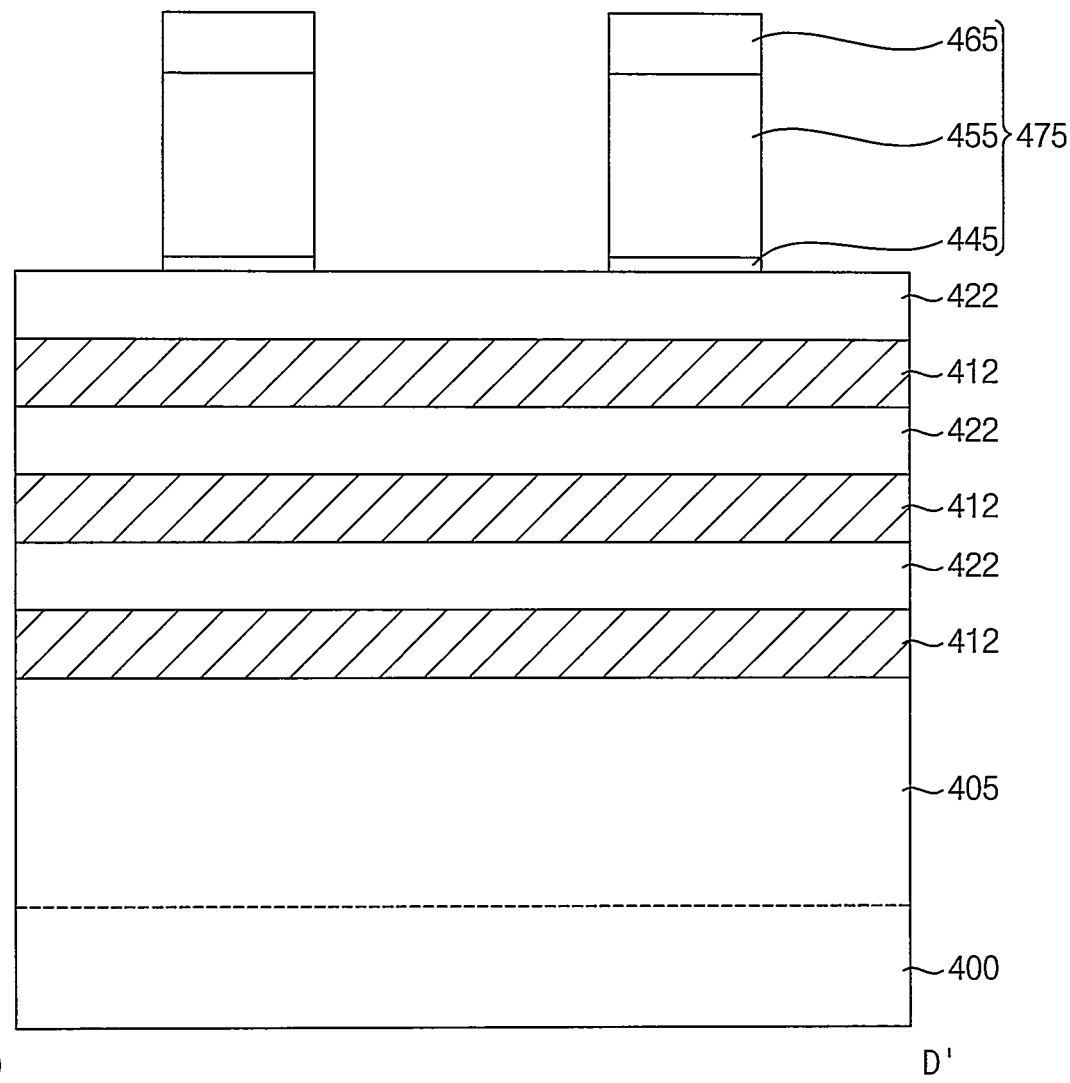
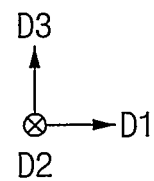

FIG. 41
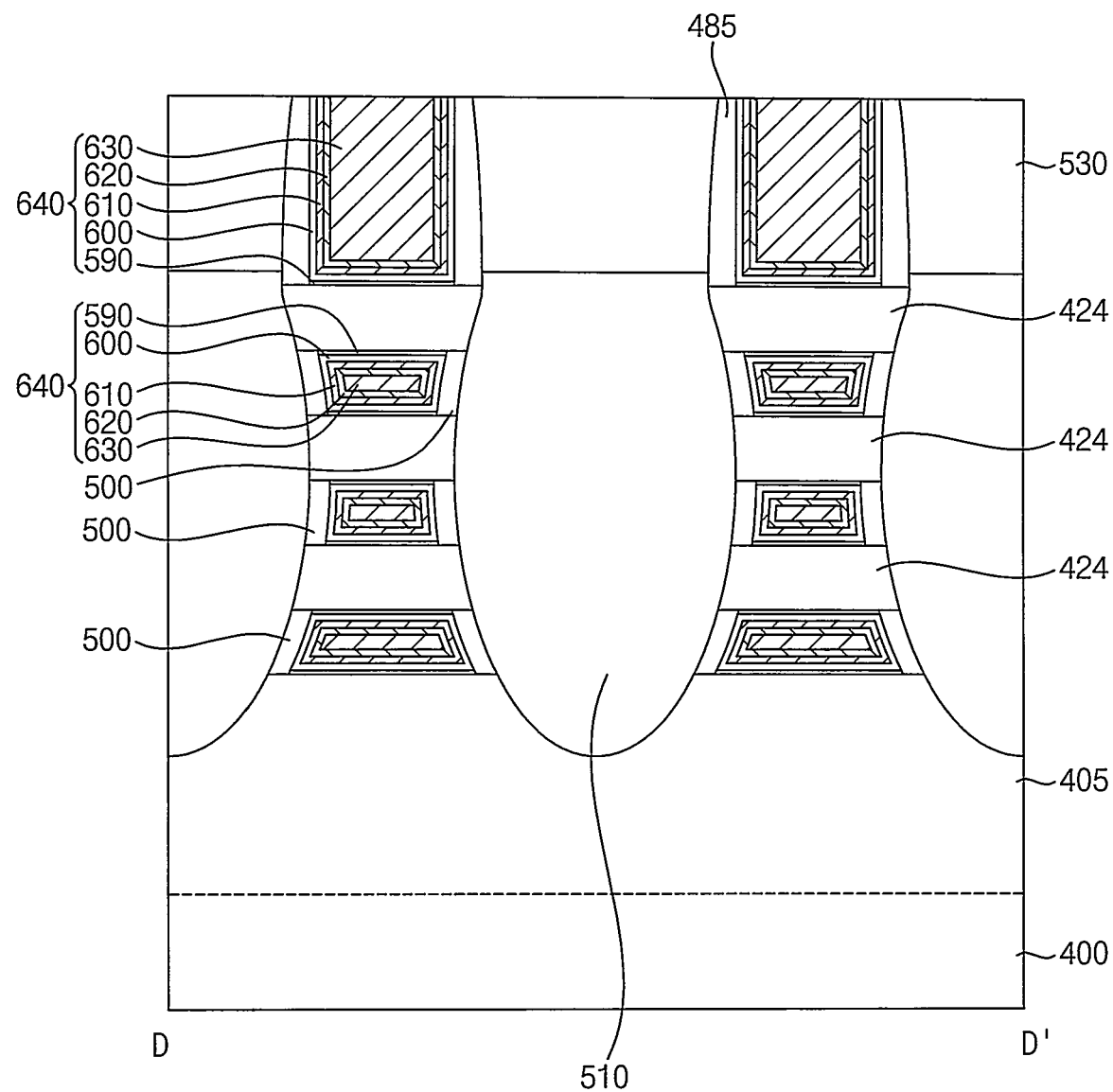
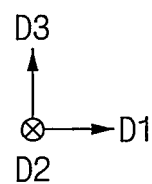

SEMICONDUCTOR DEVICES INCLUDING INSULATION PATTERNS WITH DIFFERENT CARBON CONCENTRATIONS

CROSS-REFERENCE TO RELATED APPLICATION

This application is based on and claims priority under 35 U.S.C. § 119 to Korean Patent Application No. 10-2021-0099667, filed on Jul. 29, 2021 in the Korean Intellectual Property Office (KIPO), the disclosures of which are incorporated by reference herein in its entirety.

TECHNICAL FIELD

Example embodiments of the present disclosure relate to semiconductor devices. More particularly, example embodiments of the present disclosure relate to field effect transistor (FET).

As a semiconductor device becomes highly integrated, a separation distance between contact plugs of a transistor may decrease. Accordingly, electrical characteristics of the semiconductor device may be deteriorated.

SUMMARY

Example embodiments provide a semiconductor device having improved characteristics.

According to an embodiment, there is provided a semiconductor device, including: a gate structure disposed on a substrate; a source and drain layer disposed on the substrate adjacent the gate structure; a first contact plug disposed on the source and drain layer; an insulation pattern structure disposed on the first contact plug, the insulation pattern structure including insulation patterns having different carbon concentrations; and a second contact plug disposed on the gate structure.

According to an embodiment, there is provided a semiconductor device, including: a plurality of channels disposed above a substrate and spaced apart from each other in a vertical direction substantially perpendicular to an upper surface of the substrate, each of the plurality of channels extending in a first direction substantially parallel to the upper surface of the substrate: a gate structure disposed above the substrate and extending in a second direction substantially parallel to the upper surface of the substrate and intersecting the first direction, the gate structure disposed on lower and upper surfaces of each of the plurality of channels: a source and drain layer disposed on the substrate adjacent to the gate structure, the source and drain layer being connected to each of opposite sidewalls of the plurality of channels in the first direction; a first contact plug disposed on the source and drain layer: an insulation pattern structure disposed on the first contact plug, the insulation pattern structure including insulation patterns having different carbon concentrations; and a second contact plug disposed on the gate structure.

According to an embodiment, there is provided a semiconductor device, including: a gate structure disposed on a substrate: a capping pattern disposed on the gate structure; a source and drain layer disposed on the substrate adjacent the gate structure; a first contact plug disposed on the source and drain layer; an insulation pattern structure disposed on the first contact plug, the insulation pattern structure including a first insulation pattern, a second insulation pattern and a third insulation pattern sequentially stacked in a vertical direction substantially perpendicular to an upper surface of the substrate, and each of the first insulation pattern, the second insulation pattern and the third insulation pattern having different carbon concentrations; and a second contact plug disposed on the gate structure through the capping pattern, the second contact plug being connected to a portion of the insulation pattern structure.

In the semiconductor device in accordance with example embodiments, an electrical short between contact plugs may be prevented, and thus the semiconductor device may have improved electrical characteristics.

BRIEF DESCRIPTION OF THE DRAWINGS

Embodiments of the inventive concept will be more clearly understood from the following detailed description taken in conjunction with the accompanying drawings in which:

FIG. 1 is a plan view of a semiconductor device according to an embodiment;

FIGS. 5 to 21 are plan views and cross-sectional views illustrating a method of manufacturing a semiconductor device according to embodiments:

FIGS. 25 to 37 are plan views and cross-sectional views illustrating a method of manufacturing a semiconductor device according to embodiments:

FIGS. 40 and 41 are plan views illustrating a method of manufacturing a semiconductor device according to embodiments.

DETAILED DESCRIPTION

A semiconductor device and a method of manufacturing the same in accordance with example embodiments will be described more fully hereinafter with reference to the accompanying drawings. In the disclosure, two directions substantially parallel to an upper surface of a substrate and crossing each other may be referred to as a first direction and a second direction, respectively, and a direction substantially perpendicular to the upper surface of the substrate may be referred to as a third direction. In example embodiments, the first and second directions may be substantially perpendicular to each other.

Figure 2:
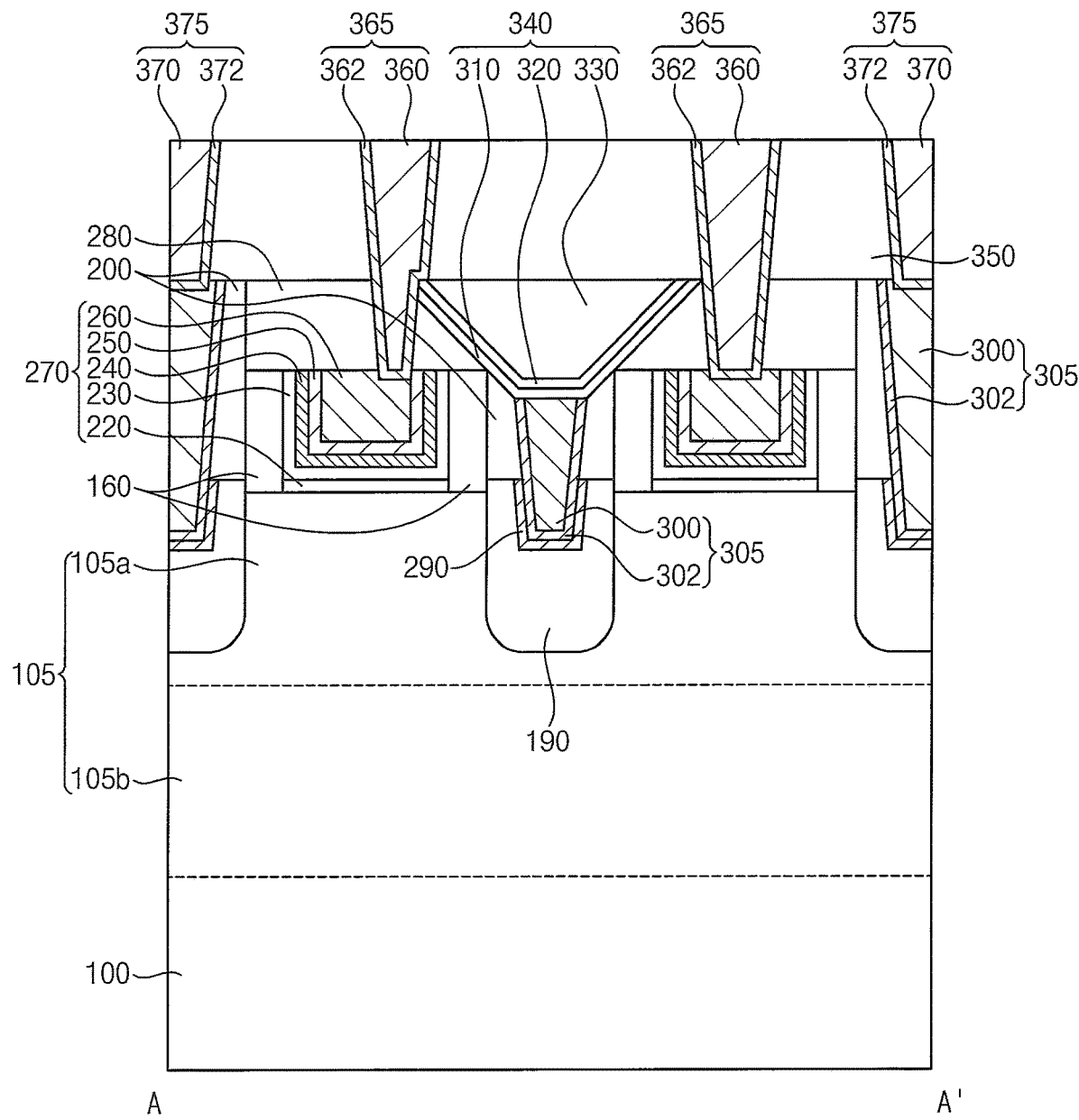
FIG. 2 is a cross-sectional view of a semiconductor device taken along a line A-A' in FIG. 1, according to an embodiment.
Figure 3:
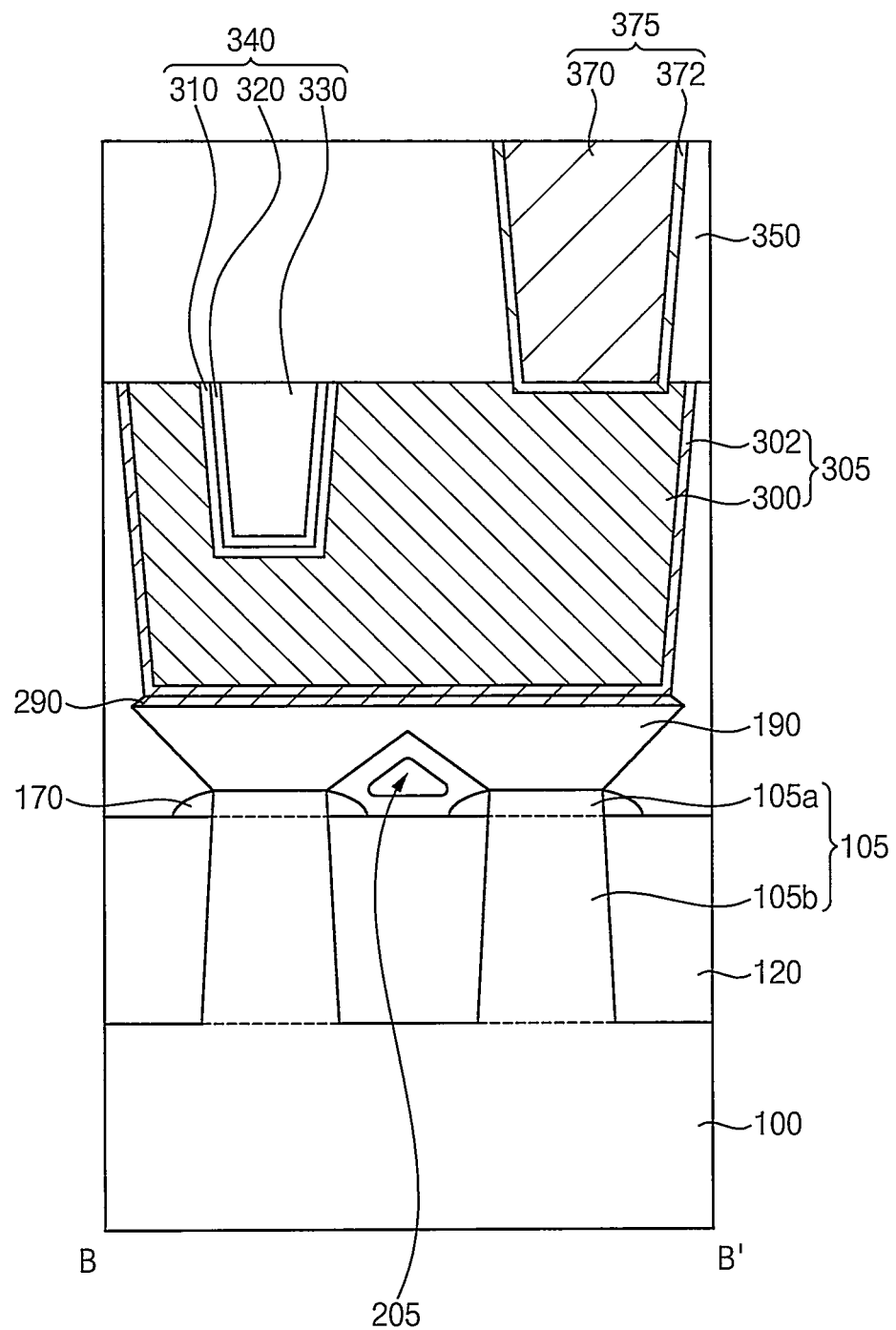
FIG. 3 is a cross-sectional view of a semiconductor device taken along a line B-B' in FIG. 1, according to an embodiment.
Figure 4:
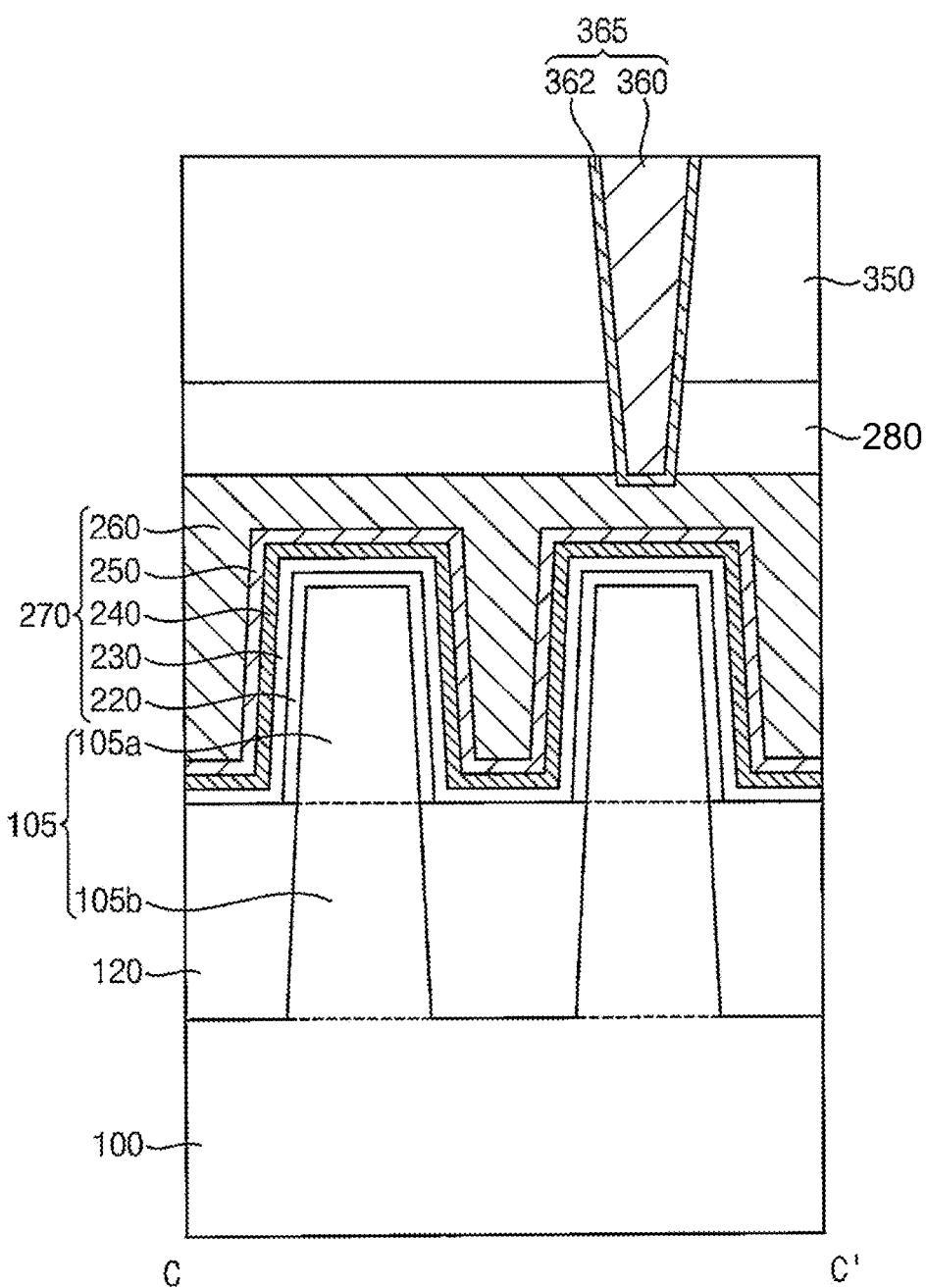
FIG. 4 is a cross-sectional view of a semiconductor device taken along a line C-C' in FIG. 1, according to an embodiment.

FIG. 1 is a plan view illustrating a semiconductor device according to an embodiment. FIGS. 2 to 4 are the cross-sectional views. FIG. 2 is a cross-sectional view taken along a line A-A' of FIG. 1, FIG. 3 is a cross-sectional view taken along a line B-B' of FIG. 1, and FIG. 3 is a cross-sectional view taken along a line C-C' of FIG. 1.

Referring to FIGS. 1 to 4, the semiconductor device may include an active pattern 105, a gate structure 270, a gate spacer 160, a capping pattern 280, an insulation pattern structure 340, a source and drain layer 190, a first contact plug 305, a second contact plug 365 and a third contact plug 375. The semiconductor device may further include an isolation pattern 120, a fin spacer 170, a first insulating interlayer 200, a second insulating interlayer 350, and a metal silicide pattern 290.

The substrate 100 may include a semiconductor material, e.g., silicon, germanium, silicon-germanium, etc., or III-V semiconductor compounds, e.g., gallium phosphide (GaP), gallium arsenide (GaAs), gallium antimonide (GaSb), etc. In some embodiments, the substrate 100 may include a silicon-on-insulator (SOI) substrate or a germanium-on-insulator (GOI) substrate.

Referring to FIG. 3, an isolation pattern 120 may be formed on the substrate 100, and the active pattern 105 may be defined by the isolation pattern 120. A lower sidewall of the active pattern 105 may be covered by the isolation pattern 120, and the active pattern 105 may protrude from the isolation pattern 120 upwardly.

The active pattern 105 may have a fin shape, and thus may be referred to as an active fin. In example embodiments, the active fin 105 may extend in the first direction, and a plurality of active fins may be formed in the second direction.

The active fin 105 may include a lower active pattern 105b of which a sidewall is covered by the isolation pattern 120 and an upper active pattern 105a protruding from the isolation pattern 120. An area of the substrate 100 on which no active pattern 105 is formed may be defined as a field region.

In example embodiments, the gate structure 270 may extend in the second direction (e.g., direction D2), and a plurality of gate structures 270 may be spaced apart from each other in the first direction (e.g., direction D1). FIGS. 1 to 4 show two gate structures 270 spaced apart from each other in the first direction, however, the inventive concept may not be limited thereto.

In example embodiments, the first gate structure 270 may include an interface pattern 220 on the active fin 105. A gate insulation pattern 230, a gate barrier 240, a first gate electrode 250 and a second gate electrode 260 may be sequentially stacked on the interface pattern 220 and the isolation pattern 120. Each of the gate insulation pattern 230, the gate barrier 240, and the first and second gate electrodes 250 and 260 may extend in the second direction. In some embodiments, the interface pattern 220 may be formed not only on the active fin 105, but also on the isolation pattern 120 to extend in the second direction. The first and second gate electrodes 250 and 260 together may be referred to as a gate electrode structure, and the first gate electrode 250 may be referred to as a work-function control pattern. In some embodiments, the gate electrode structure may include only one of the first and second gate electrodes 250 and 260.

A sidewall and a lower surface of the second gate electrode 260 may be covered by the first gate electrode 250, a sidewall and a lower surface of the first gate electrode 250 may be covered by the gate barrier 240, a sidewall and a lower surface of the gate barrier 240 may be covered by the gate insulation pattern 230, and a lower surface of the gate insulation pattern 230 may be disposed on the interface pattern 220.

The interface pattern 220 may include an oxide, e.g., silicon oxide, and the gate insulation pattern 230 may include a metal oxide having a high dielectric constant, e.g., hafnium oxide, tantalum oxide, zirconium oxide, etc.

The gate barrier 240 may include a metal nitride, e.g., titanium nitride, titanium aluminum nitride, tantalum nitride, tantalum aluminum nitride, etc. The first gate electrode 250 may include a metal alloy, a metal carbide, a metal oxynitride, a metal carbonitride, or a metal oxycarbonitride, e.g., titanium aluminum, titanium aluminum carbide, titanium aluminum oxynitride, titanium aluminum carbonitride, titanium aluminum oxycarbonitride, etc., and the second gate electrode 260 may include a low resistance metal, e.g., tungsten, aluminum, copper, tantalum, etc.

The gate spacer 160 may cover sidewalls of the first gate structure 270 in the first direction, and may extend in the second direction. Moreover, as shown in FIG. 3, sidewalls of the upper active pattern 105a may be covered by a fin spacer 170 in the second direction. The gate spacer 160 and the fin spacer 170 may include a nitride, e.g., silicon nitride. In an example embodiment, each of the gate spacer 160 and the fin spacer 170 may have a multi-layered structure including a nitride layer and an oxide layer sequentially stacked.

Referring to FIG. 2, the capping pattern 280 may be formed on the gate structure 270 and the gate spacer 160, and may be in contact with upper surfaces thereof. The capping pattern 280 may also extend in the second direction. The capping pattern 280 may include a nitride, e.g., silicon nitride.

The source and drain layer 190 may be formed on the active fin 105 between a plurality of gate structures 270, and an upper portion of the source and drain layer 190 may contact a sidewall of the gate spacer 160. In example embodiments, the source and drain layer 190 may have a cross-section having a pentagon-like shape when viewed from the first direction (e.g., direction D1).

In example embodiments, when a distance between each of the active fins 105 in the second direction is small, each of the source and drain layers 190 grown on each of the active fins 105 may be merged with each other. FIGS. 1 and 3 show two source and drain layers 190 grown on two active fins 105 are merged with each other, however, the inventive concept may not be limited thereto.

In an example embodiment, the source and drain layer 190 may include single crystalline silicon-germanium layer doped with p-type impurities. The source and drain layer 190 may serve as a source and drain region of a positive-channel metal oxide semiconductor (PMOS) transistor.

Alternatively or additionally, the source and drain layer 190 may include single crystalline silicon carbide layer doped with n-type impurities or single crystalline silicon layer doped with n-type impurities. The source and drain layer 190 may serve as a source and drain region of a negative-channel metal oxide semiconductor (NMOS) transistor.

The first insulating interlayer 200 may be formed on the active fin 105 and the isolation pattern 120 of the substrate 100, and may be disposed on a sidewall of the gate spacer 160 on each of opposite sidewalls of the gate structure 270, a sidewall of the capping pattern 280, and an upper surface of the source and drain layer 190. The first insulating interlayer 200 may not entirely fill a space between the merged source and drain layers 190 and the isolation pattern 120, and thus an air gap 205 may be formed. The first insulating interlayer 200 may include an oxide, e.g., silicon oxide.

The first contact plug 305 may extend through the first insulating interlayer 200 between the gate structures 270 spaced apart from each other in the first direction, and may contact the upper surface of the source and drain layer 190. In example embodiments, the first contact plug 305 may include a first metal pattern 300 and a first barrier pattern 302 covering a lower surface and a sidewall of the first metal pattern 300. The first metal pattern 300 may include a metal, e.g., tungsten, copper, aluminum, cobalt, molybdenum, etc., and the first barrier pattern 302 may include a metal nitride, e.g., titanium nitride, tantalum nitride, tungsten nitride, etc.

In example embodiments, the first contact plug 305 may not contact a sidewall of the gate structure 270, and the first insulating interlayer 200 may be formed between the sidewall of the gate structure 270 and the first contact plug 305.

In example embodiments, an upper surface of the first contact plug 305 may be substantially coplanar with an upper surface of the capping pattern 280. The first contact plug 305 may extend through the first insulating interlayer 200, and thus an upper surface of the first insulating interlayer 200 and the upper surface of the first contact plug 305 may be substantially coplanar with each other.

The metal silicide pattern 290 may be formed between the first barrier pattern 302 and the upper surface of the source and drain layer 190. Specifically, the metal silicide pattern 290 may be disposed between a lower surface and a lower sidewall of the first barrier pattern 302 and the upper surface of the source and drain layer 190. The metal silicide pattern 290 may include a metal silicide pattern, e.g., titanium silicide, cobalt silicide, nickel silicide, etc.

The insulation pattern structure 340 may be disposed on the upper surface of the first contact plug 305, and may include a first insulation pattern 310, a second insulation pattern 320 and a third insulation pattern 330 sequentially stacked in the third direction (e.g., direction D3).

In example embodiments, portions of the first insulation pattern 310 and the second insulation pattern 320 may be inclined, and an upper surface of the third insulation pattern 330 may be flat.

The first to third insulation patterns 310, 320 and 330 may include a low-k dielectric material, e.g., silicon oxycarbide (SiOC), silicon carbonitride (SiCN), silicon oxycarbonitride (SiOCN), or silicon boroncarbonitride (SiBCN).

The first to third insulation patterns 310, 320 and 330 may have different carbon concentrations. In example embodiments, a carbon concentration of the second insulation pattern 320 may be greater than carbon concentrations of the first and third insulation patterns 310 and 330, and the carbon concentration of the first insulation pattern 310 may not be smaller than the carbon concentration of the third insulation pattern 330. That is, a dielectric constant of the second insulation pattern 320 may be greater than dielectric constants of the first and third insulation patterns 310 and 330, and the dielectric constant of the first insulation pattern 310 may not be smaller than the dielectric constant of the third insulation pattern 330.

In one embodiment, the carbon concentration of each of the first and third insulation patterns 310 and 330 may be greater than about 0 atom % and less than or equal to about 7 atom %, and the carbon concentration of the second insulation pattern 320 may be greater than and equal to about 10 atom % and less than or equal to about 15 atom %. If the carbon concentration of the second insulation pattern 320 is greater than about 15 atom % or the carbon concentration of the third insulation pattern 330 is greater than about 7 atom %, a dielectric constant of the insulation pattern structure 340 may be increased, and thus insulation characteristics of the insulation pattern structure 340 may be deteriorated.

The second insulating interlayer 350 may be formed on the first insulating interlayer 200, the capping pattern 280 and the insulation pattern structure. The second insulating interlayer 350 may include an oxide, e.g., silicon oxide, or a low-k dielectric material having a dielectric constant less than that of silicon oxide.

The second contact plug 365 may be disposed on the gate structure 270 and may pass through the second insulating interlayer 350 and the capping pattern 280. The second contact plug 365 may contact an upper surface of the gate structure 270. Specifically, a lower surface of the second contact plug 365 may contact an upper surface of the second gate electrode 260 of the gate structure 270.

In example embodiments, the second contact plug 365 may be misaligned and formed on the insulation pattern structure 340. For example, a portion of the second contact plug 365 may contact an upper surface of the insulation pattern structure 340. The second contact plug 365 may contact upper surfaces of the first and second insulation patterns 310 and 320 of the insulation pattern structure 340.

An upper surface of the second contact plug 365 may be formed to be higher than an upper surface of the first contact plug 305.

The third contact plug 375 may extend through the second insulating interlayer 350 and may be disposed on the upper surface of the first contact plug 305.

In example embodiments, the second contact plug 365 may include a second metal pattern 360 and a second barrier pattern 362 covering a lower surface and a sidewall of the second metal pattern 360, and the third contact plug 375 may include a third metal pattern 370 and a third barrier pattern 372 covering a lower surface and a sidewall of the third metal pattern 370. The second and third metal patterns 360 and 370 may include a material substantially the same as that of the first metal pattern 300, and the second and third barrier patterns 362 and 372 may include a material substantially the same as that of the first barrier pattern 302.

FIGS. 1 to 4 show that two second contact plugs 365 are spaced apart from each other in the first direction on the first contact plug 305 and two third contact plugs 375 are spaced apart from each other in the first direction, however, the inventive concept may not be limited thereto. That is, the layouts of the second and third contact plugs 365 and 375 are not limited thereto and may be variously configured.

As described above, the second contact plug 365 may be misaligned and may also be formed on the insulation pattern structure 340. That is, the second contact plug 365 may be formed adjacent to the first contact plug 305 in the first direction, and thus an electrical short may occur between the first and second contact plugs 305 and 365.

However, in example embodiments, the insulation pattern structure 340 including a low-k dielectric material may be formed on the first contact plug 305, and thus the electric short may not occur between the first and second contact plugs 305 and 365. Accordingly, electrical characteristics of the semiconductor device including the insulation pattern structure 340 may be improved.

Hereinbefore, the semiconductor device is described as a finFET, however, the semiconductor device may be the semiconductor device having a different structure, e.g., a planar channel transistor (PCAT), a recessed channel transistor (RCAT), etc.

FIGS. 5 to 21 are plan views and cross-sectional views illustrating a method of manufacturing a semiconductor device according to example embodiments. Particularly, FIGS. 5, 9, 12, 15 and 19 are the plan views, and FIGS. 7-8, 10-11, 13-14, 16-18 and 20-21 are the cross-sectional views.

Figure 5:
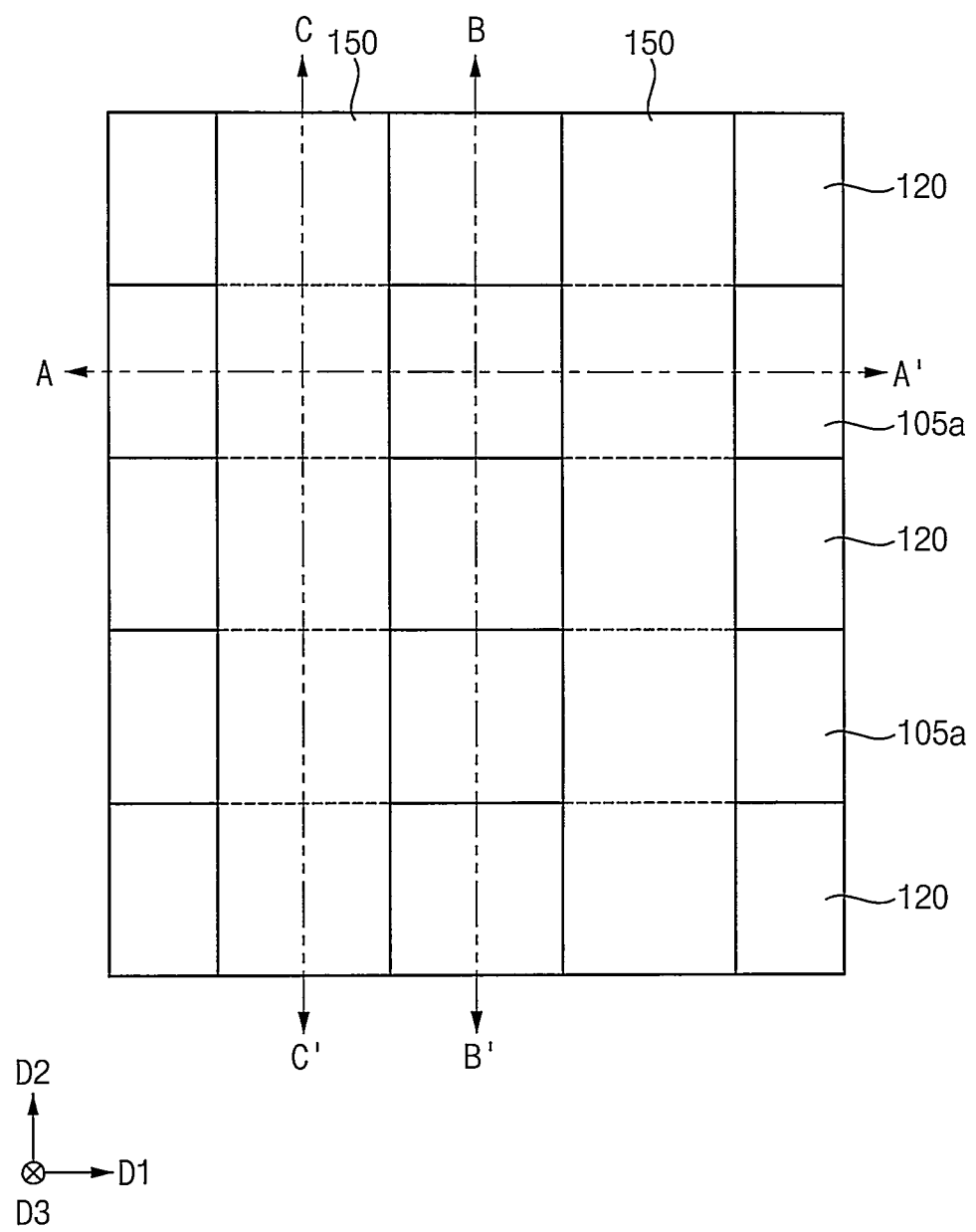
Figure 6:
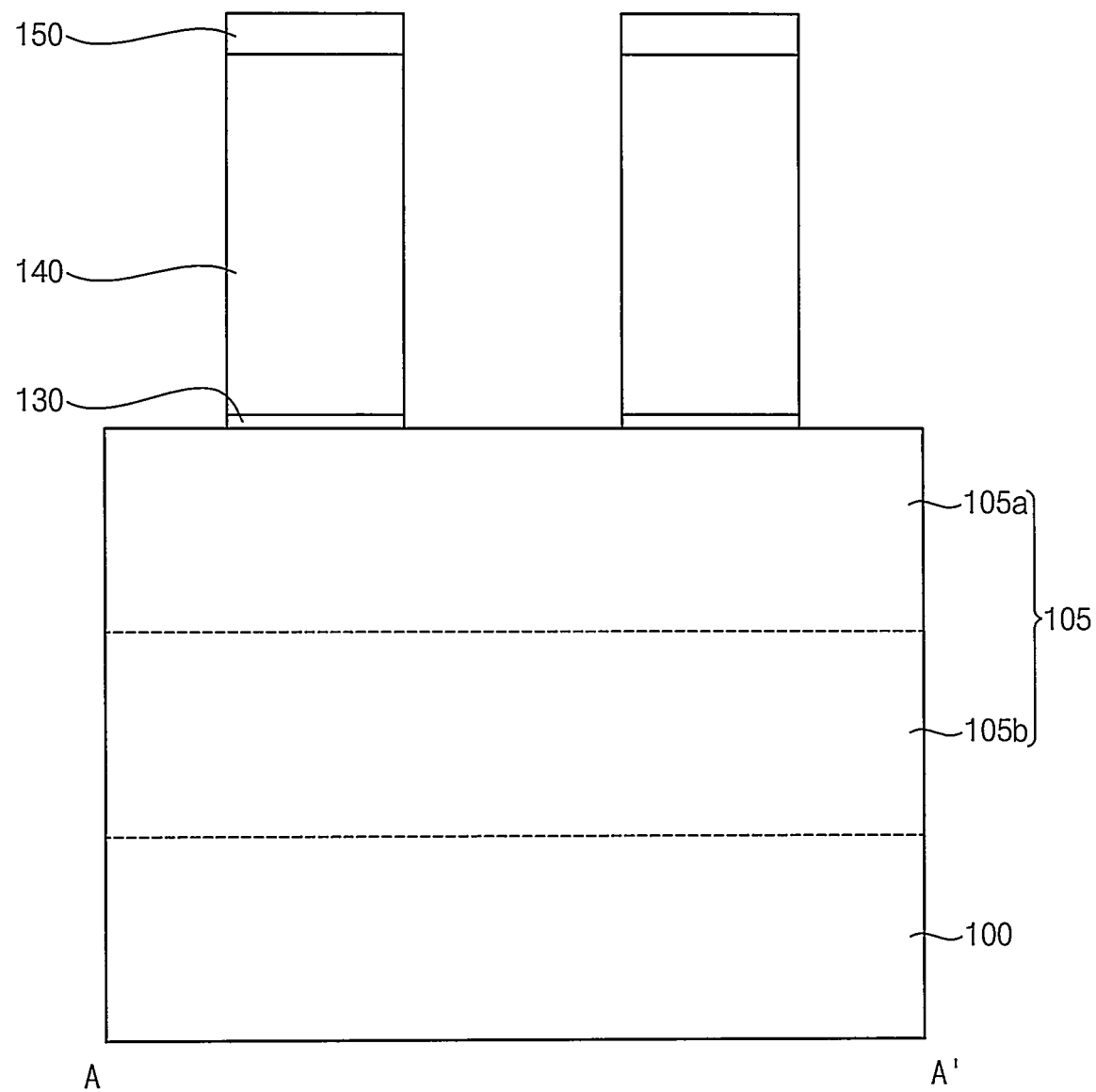
Figure 7:
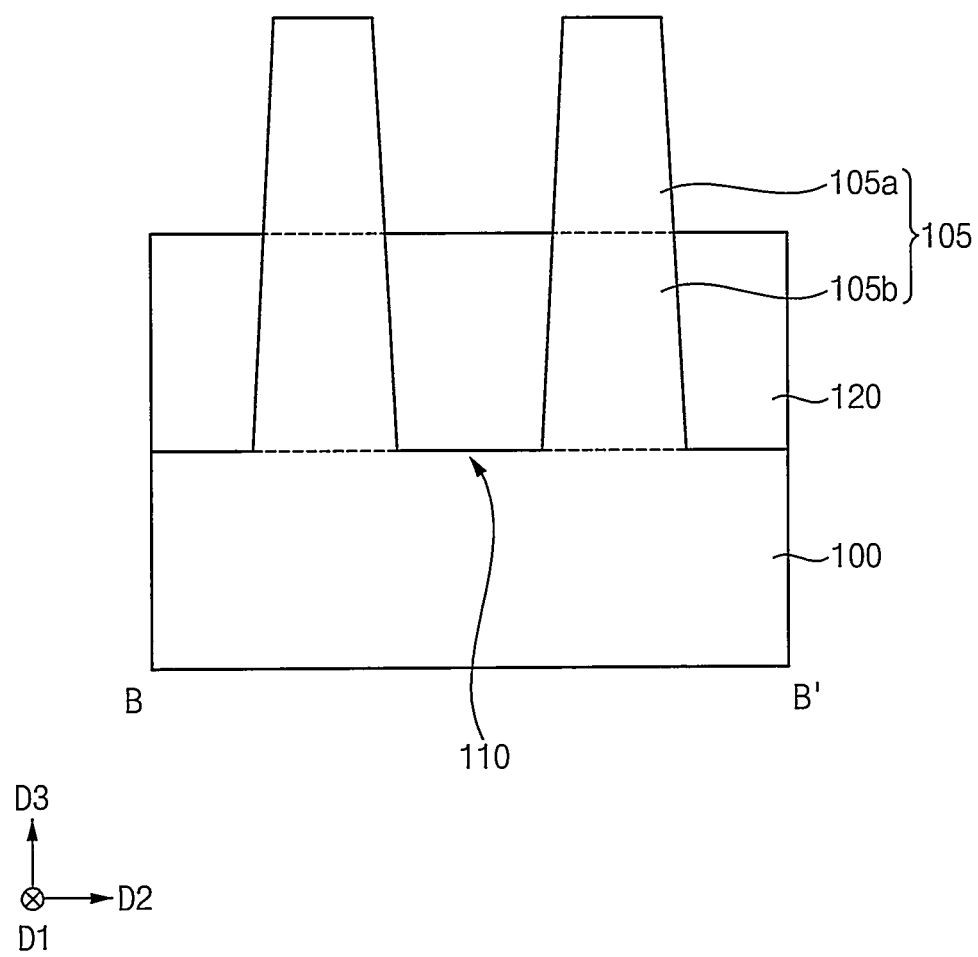
Figure 8:
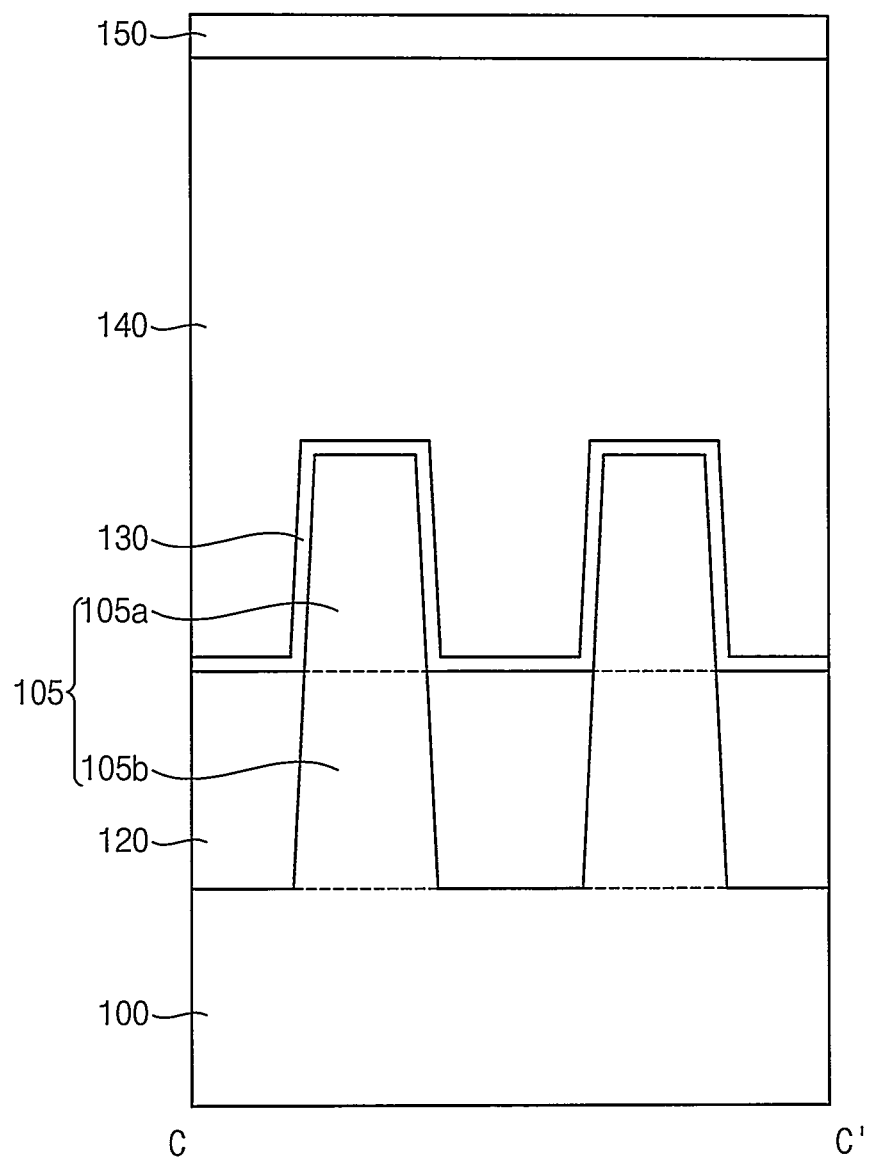
Figure 9:
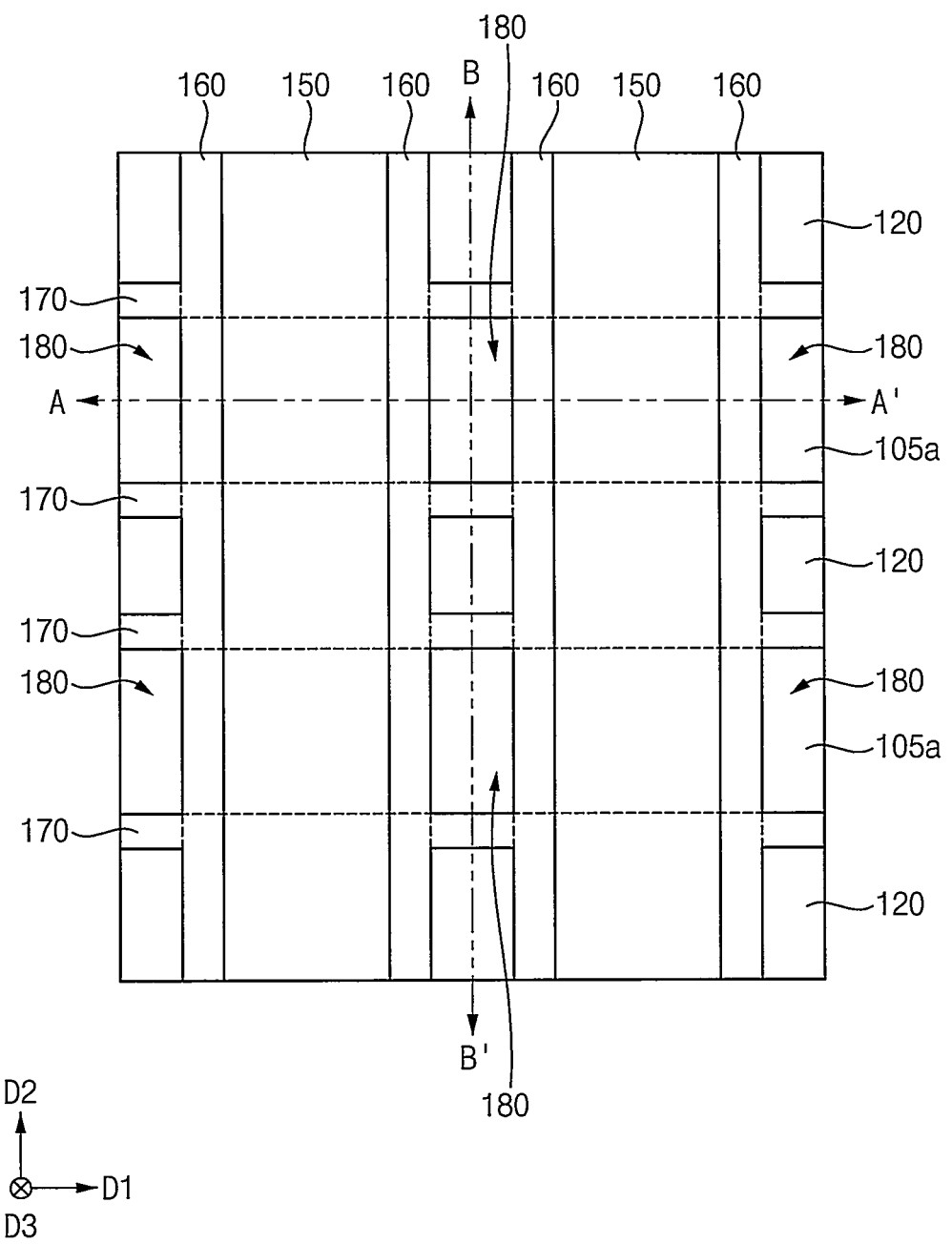
Figure 10:
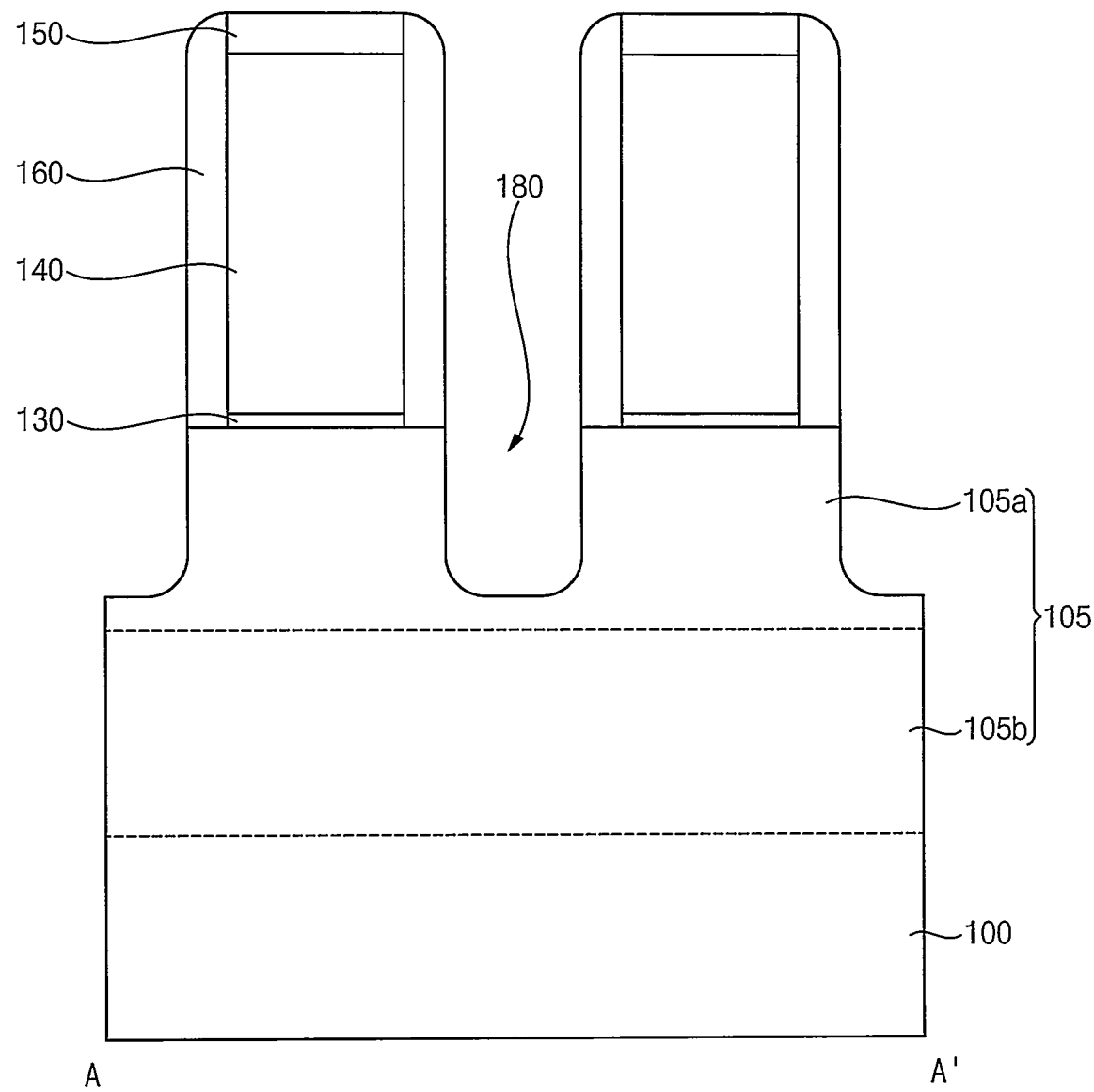
Figure 11:
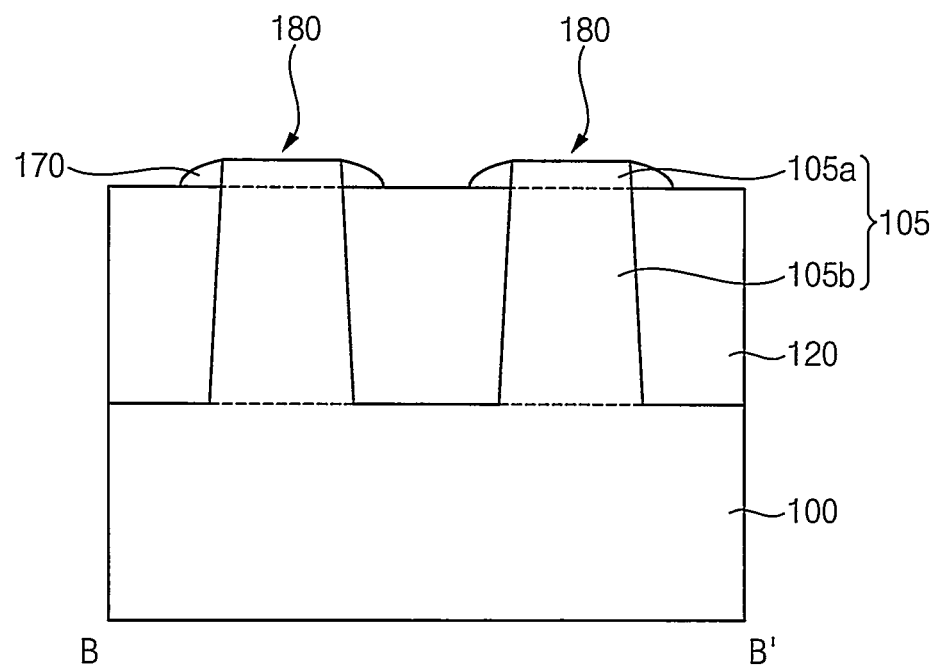
Figure 12:
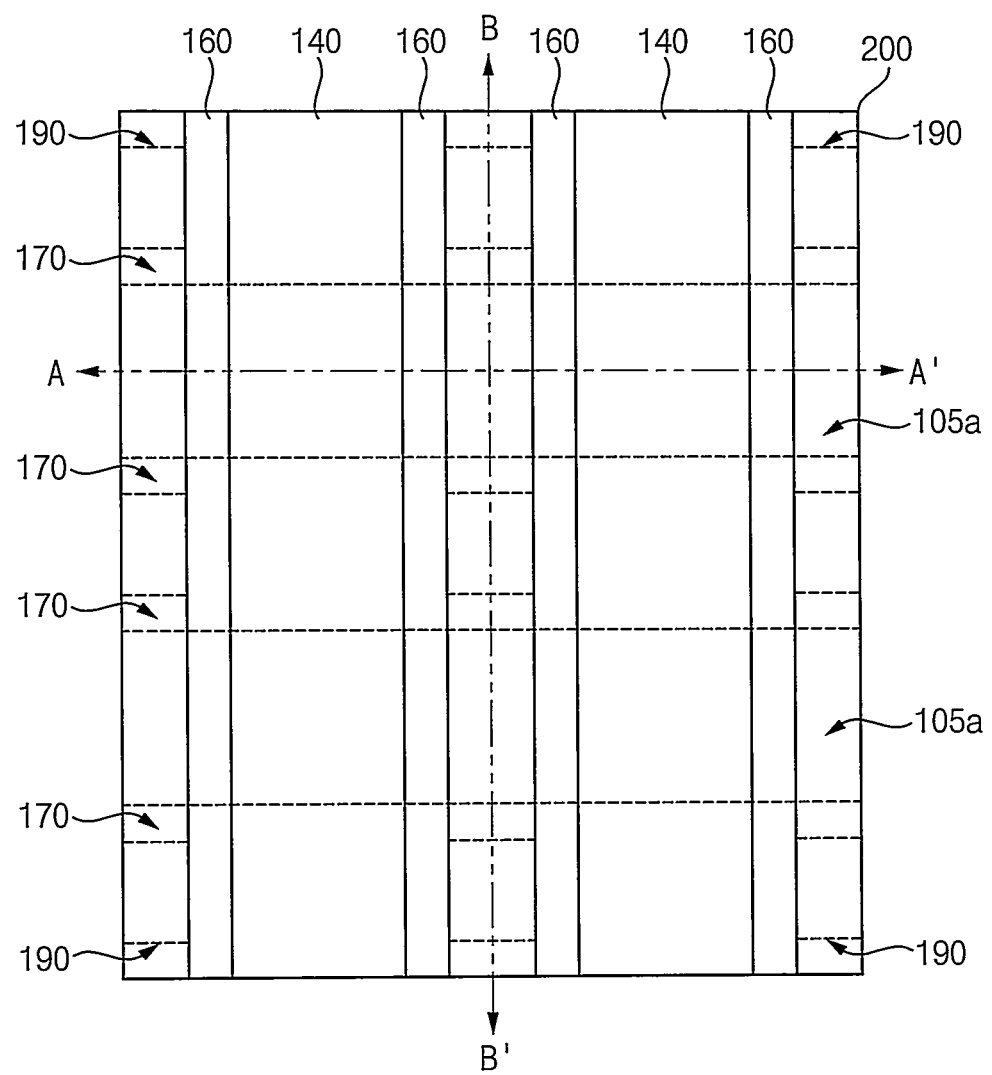
Figure 14:
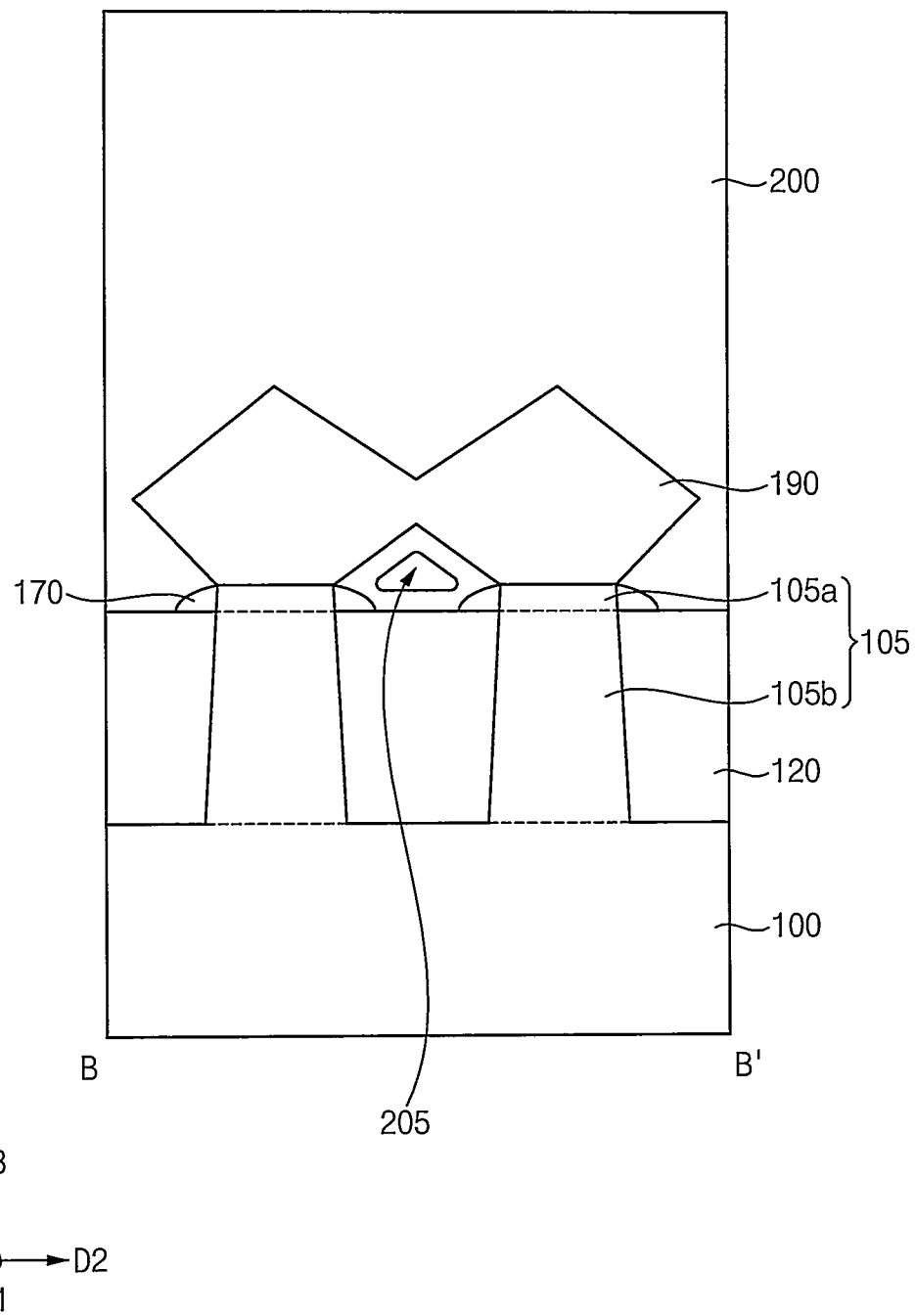
Figure 15:
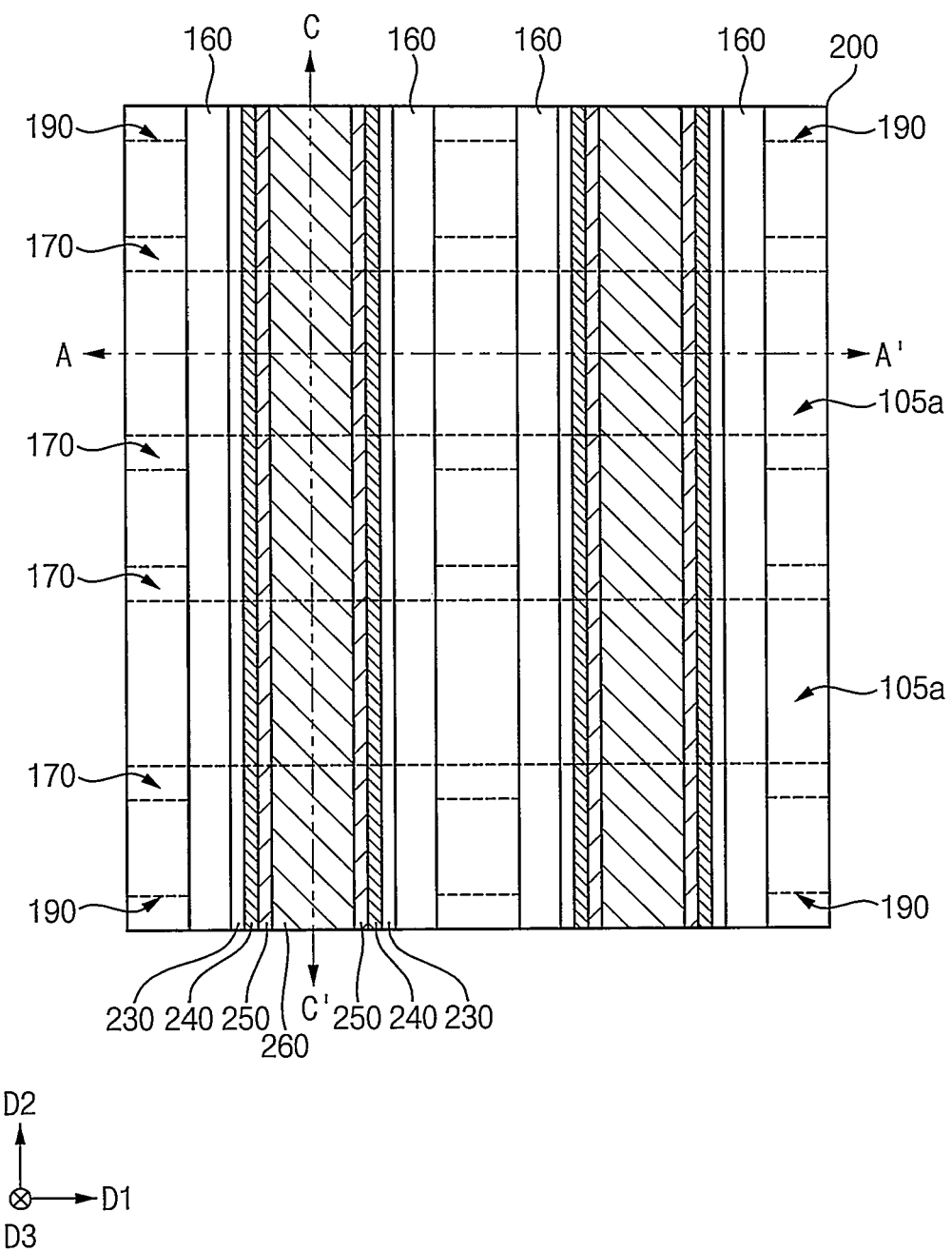
Figure 16:
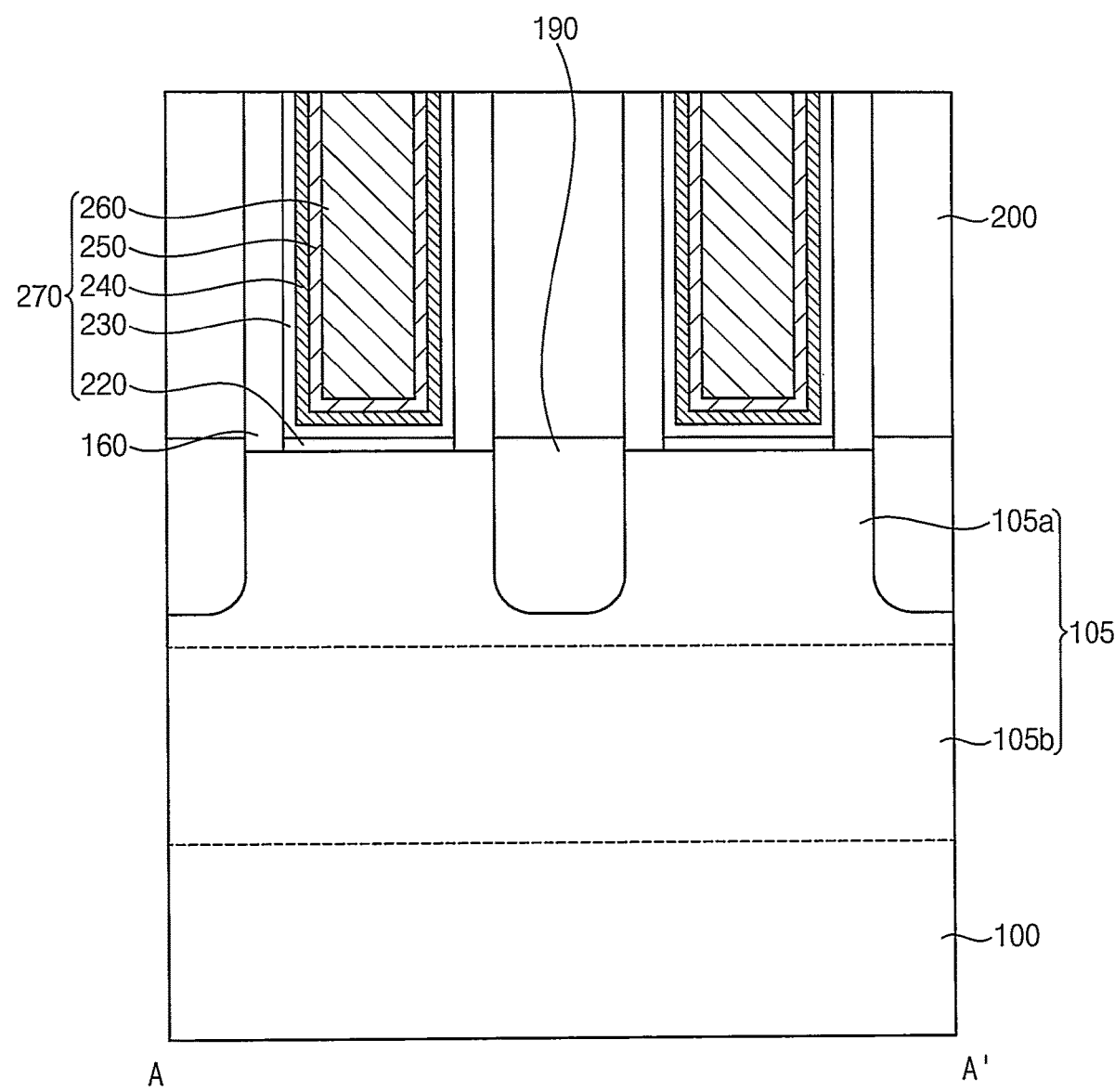
Figure 17:
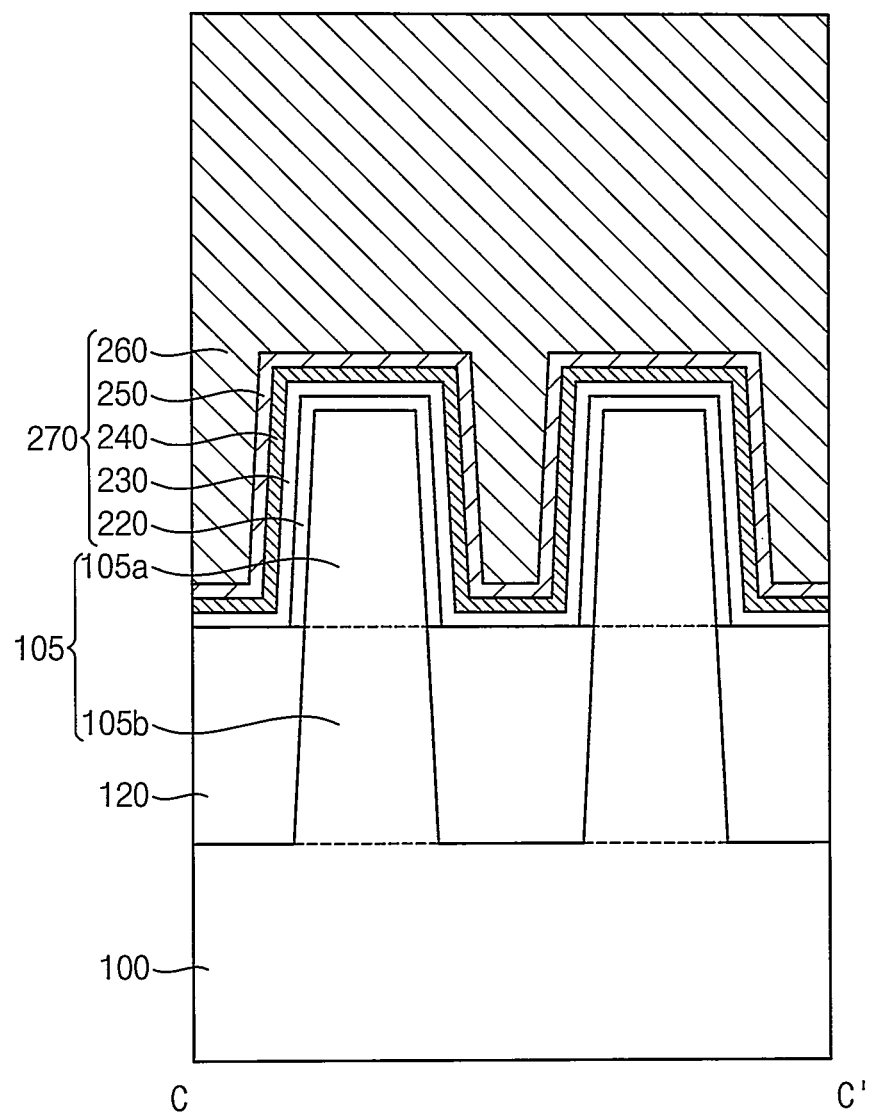

FIGS. 6, 10, 13, 16, 18 and 20-21 are cross-sectional views taken along lines A-A' of the corresponding plan views of FIGS. 5, 9, 12, 15 and 19, respectively, FIGS. 7, 11 and 14 are cross-sectional views taken along lines B-B' of the corresponding plan views of FIGS. 5, 9 and 12, respectively, and FIGS. 8 and 17 are cross-sectional views taken along lines C-C' of the corresponding plan views of FIGS. 5 and 15, respectively.

Referring to FIGS. 5 to 8, an upper portion of a substrate 100 may be partially etched to form a first recess 110, an isolation pattern 120 filling a lower portion of the first recess 110 may be formed, and a dummy gate structure may be formed on the substrate 100 and the isolation pattern 120.

As the first recess 110 is formed on the substrate 100, an active pattern 105 may be defined. The active pattern 105 may be referred to as an active fin 105.

In example embodiments, the isolation pattern 120 may be formed by forming an isolation layer on the substrate 100 to fill the first recess 110, the isolation layer may be planarized until an upper surface of the substrate 100 is exposed, and an upper portion of the isolation layer may be removed to expose an upper portion of the first recess 110. The active fin 105 may include a lower active pattern 105*b* of which a sidewall may be covered by the isolation pattern 120 and an upper active pattern 105*a* protruding from the isolation pattern 120.

The dummy gate structure may be formed by sequentially forming a dummy gate insulation layer, a dummy gate electrode layer, and a dummy gate mask layer on the active fin 105 and the isolation pattern 120 of the substrate 100, patterning the dummy gate mask layer to form a dummy gate mask 150 on the substrate 100, and sequentially etching the dummy gate electrode layer and the dummy gate insulation layer using the dummy gate mask 150 as an etching mask. Thus, the dummy gate structure including the dummy gate insulation pattern 130, the dummy gate electrode 140 and the dummy gate mask 150 sequentially stacked may be formed on the substrate 100.

The dummy gate insulation layer may include an oxide, e.g., silicon oxide, the dummy gate electrode layer may include, e.g., polysilicon, and the dummy gate mask layer may include a nitride, e.g., silicon nitride.

The dummy gate insulation layer may be formed by, e.g., a chemical vapor deposition (CVD) process, an atomic layer deposition (ALD) process, etc. Alternatively or additionally, the dummy gate insulation layer may be formed by a thermal oxidation process on an upper surface of the substrate 100, and in this case, the dummy gate insulation layer may be formed only on an upper surface of the active fin 105. The dummy gate electrode layer and the dummy gate mask layer may be formed by, e.g., a CVD process, an ALD process, etc.

Referring to FIGS. 9 to 11, a spacer layer may be formed on the active fin 105 and the isolation pattern 120 to cover the dummy gate structure, and may be anisotropically etched to form the gate spacer 160 on each of opposite sidewalls in the first direction of the dummy gate structure. A fin spacer 170 may be formed on each of opposite sidewalls in the second direction of the upper active pattern 105*a*.

An upper portion of the active fin 105 adjacent to the gate spacer 160 may be removed to form a second recess 180.

Referring to FIG. 10, only a portion of the upper active pattern 105*a* is etched to form the second recess 180, and thus a bottom of the second recess 180 is higher than an upper surface of the lower active pattern 105*b*, however, the inventive concept may not be limited thereto. That is, the second recess 180 may be formed by etching not only the upper active pattern 105*a*, but also a portion of the lower active pattern 105*b*, and thus the bottom of the second recess 180 may be lower than an uppermost surface of the lower active pattern 105*b*.

When the second recess 180 is formed, the fin spacer 170 on each of opposite sidewalls of the upper active pattern 105*a* in the second direction may be partially or entirely removed.

In example embodiments, the etching process for forming the second recess 180 and the etching process for forming the gate spacer 160 and the fin spacer 170 may be performed in-situ.

Referring to FIGS. 12 to 14, a source and drain layer 190 may be formed to fill the second recess 180.

In example embodiments, the source and drain layer 190 may be formed by a selective epitaxial growth (SEG) process using an upper surface of the active fin 105 exposed by the second recess 180 as a seed.

In example embodiments, the SEG process may be performed using a silicon source gas, a germanium source gas, an etching gas, and a carrier gas, so that a single crystalline silicon-germanium layer may be formed as the source and drain layer 190. The SEG process may be performed using p-type impurity source gas, so that a single crystalline silicon-germanium layer doped with p-type impurities may be formed as the source and drain layer 190.

Alternatively or additionally, the SEG process may be performed using a silicon source gas, a carbon source gas, an etching gas, and a carrier gas, so that a single crystalline silicon carbide layer may be formed as the source and drain layer 190. The SEG process may be performed using n-type impurity source gas, so that a single crystalline silicon carbide layer doped with n-type impurities may be formed as the source and drain layer 190. Alternatively or additionally, the SEG process may be performed using a silicon source gas, an etching gas, and a carrier gas, so that a single crystalline silicon layer may be formed as the source and drain layer 190. The SEG process may be performed using n-type impurity source gas, so that a single crystalline silicon layer doped with n-type impurities may be formed as the source and drain layer 190.

The source and drain layer 190 may grow in a vertical direction substantially perpendicular to the upper surface of the substrate 100 and in a horizontal direction substantially parallel to the upper surface of the substrate 100, and thus may contact a sidewall of the gate spacer 160.

In example embodiments, when a distance between each of the active fins 105 in the second direction is small, the source and drain layers 190 grown from the active fins 105, respectively, may be merged with each other.

A first insulating interlayer 200 may be formed on the active fin 105 and the isolation pattern 120 to cover the dummy gate structure, the gate spacer 160, the fin spacer 170 and the source and drain layer 190, and may be planarized until an upper surface of the dummy gate electrode 140 of the dummy gate structure is exposed. During the planarization process, the dummy gate mask 150 (shown in FIG. 10) may be also removed.

A space between the merged source and drain layer 190 and the isolation pattern 120 may not be entirely filled with the first insulating interlayer 200, and thus an air gap 205 may be formed.

The planarization process may be performed by a chemical mechanical polishing (CMP) process and/or an etch back process.

Referring to FIGS. 15 to 17, the exposed dummy gate electrode 140 and the dummy gate insulation pattern 130 (shown in FIG. 13) may be removed to form a first opening exposing an inner sidewall of the gate spacer 160 and an upper surface of the active fin 105, and a gate structure 270 may be formed to fill the first opening.

Particularly, a thermal oxidation process may be performed on the surface of the active fin 105 exposed by the first opening to form an interface pattern 220, and a gate insulation layer, a gate barrier layer and a first gate electrode layer may be sequentially formed on the interface pattern 220, the isolation pattern 120, the gate spacer 160 and the first insulating interlayer 200, and a second gate electrode layer may be formed on the first gate electrode to fill a remaining portion of the first opening.

The gate insulation layer, the gate barrier layer and the first and second gate electrode layers may be formed by a chemical vapor deposition (CVD) process, an atomic layer deposition (ALD) process, a physical vapor deposition (PVD) process, etc.

In some embodiments, the interface pattern 220 may be also formed by a CVD process, an ALD process, a PVD process, etc., instead of the thermal oxidation process, and the interface pattern 220 may be also formed not only on the upper surface of the active fin 105 but also on an upper surface of the isolation pattern 120 and the inner sidewall of the gate spacer 160.

The first and second gate electrode layers, the gate barrier layer, and the gate insulation layer may be planarized until the upper surface of the first insulating interlayer 200 is exposed to form a gate insulation pattern 230, a gate barrier 240, and a first gate electrode 250 sequentially stacked on the upper surface of the interface pattern 220, the upper surface of the isolation pattern 120 and the inner sidewall of the gate spacer 160, and a second gate electrode 260 may be disposed on the first gate electrode 250 and fill the remaining portion of the first opening.

The interface pattern 220, the gate insulation pattern 230, the gate barrier 240 and the first and second gate electrodes 250 and 260 that are sequentially stacked may form the gate structure 270. The first and second gate electrodes 250 and 260 may form a gate electrode structure, and the gate structure 270 and the source and drain layer 190 may form a transistor. In some embodiments, the gate electrode structure may include only one of the first gate electrode 250 and the second gate electrode 260. The transistor may form a PMOS transistor or an NMOS transistor depending on the conductivity type of the source and drain layer 190.

Figure 18:
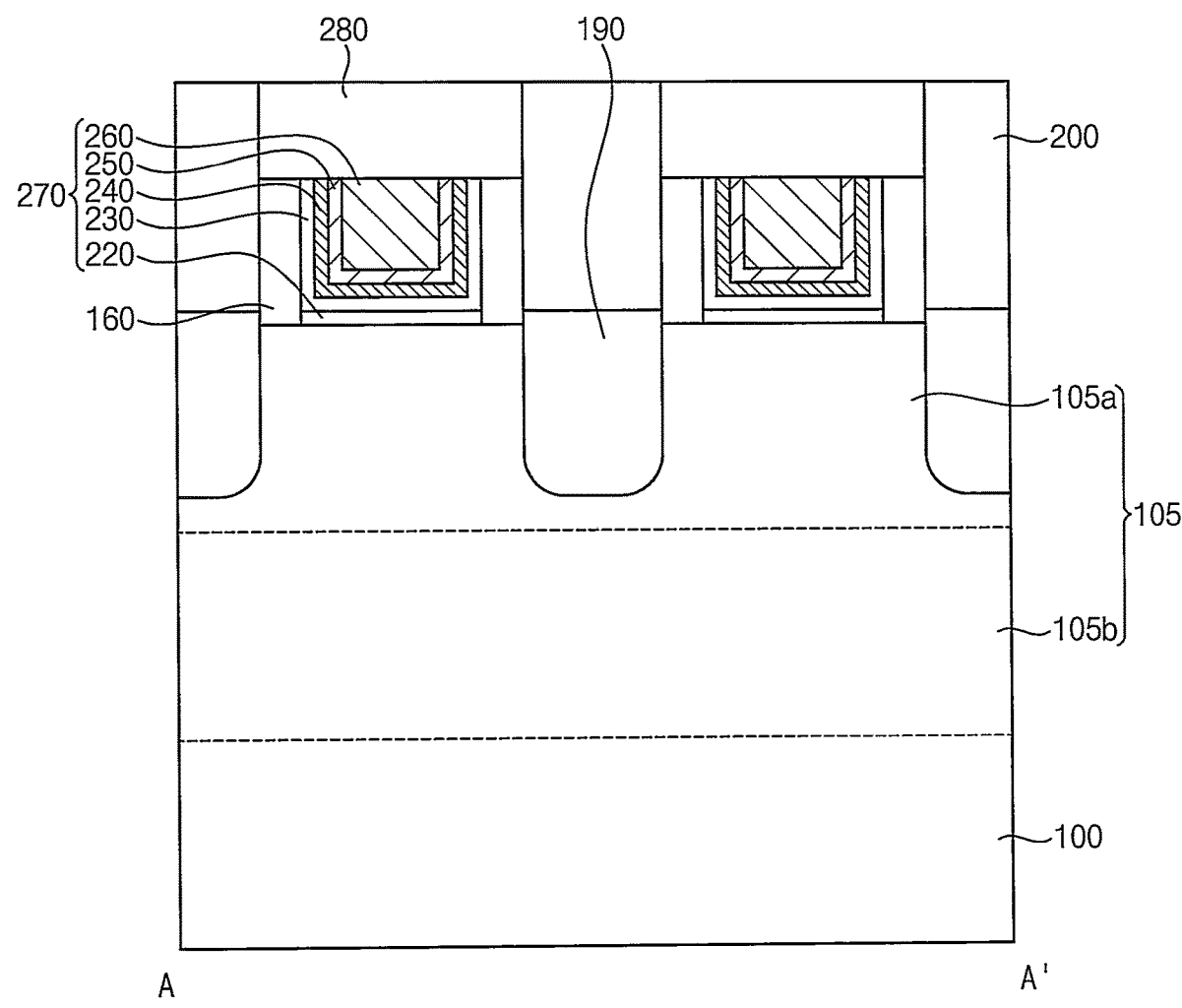

Referring to FIG. 18, upper portions of the gate structure 270 and the gate spacer 160 may be removed to form a third recess, and a capping pattern 280 may be formed by filling the third recess.

The capping pattern 280 may be planarized until the upper surface of the first insulating interlayer 200 is exposed. The planarization process may be performed by a CMP process and/or an etch back process.

Figure 19:
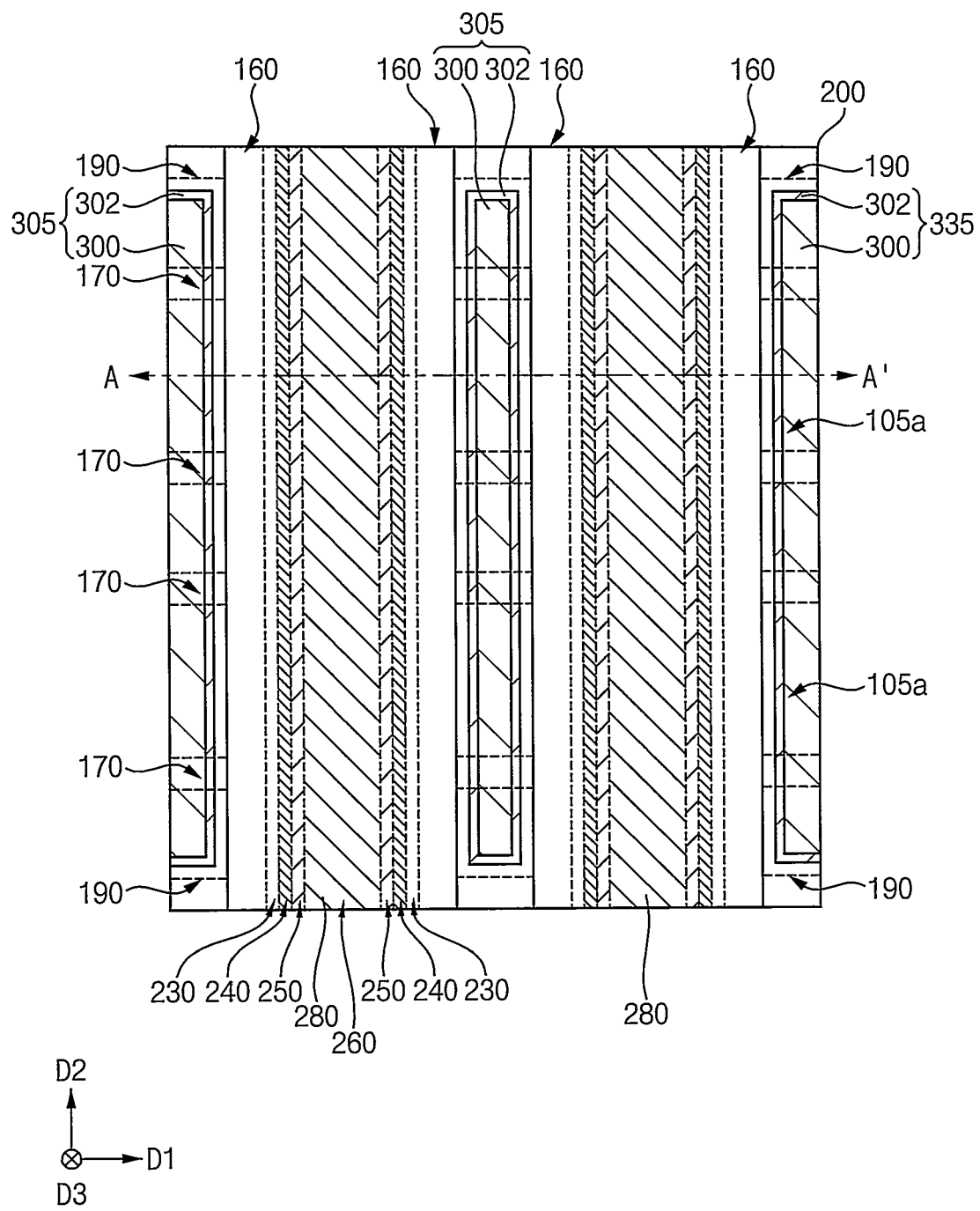

Referring to FIGS. 19 and 20, a second opening may be formed through the first insulating interlayer 200 to expose the upper surface of the source and drain layer 190 by an etching process, and the first contact plug 305 may be formed in the second opening.

Before forming the first contact plug 305 after forming the second opening, a metal silicide pattern 290 may be further formed on the upper surface of the source and drain layer 190 exposed by the second opening through a silicidation process.

The first contact plug 305 may extend in the second direction to contact the upper surface of the merged source and drain layer 190. In example embodiments, the first contact plug 305 may include a first barrier pattern 302 on the bottom and the sidewall of the second opening and a first metal pattern 300 filling a remaining portion of the second opening.

Figure 21:
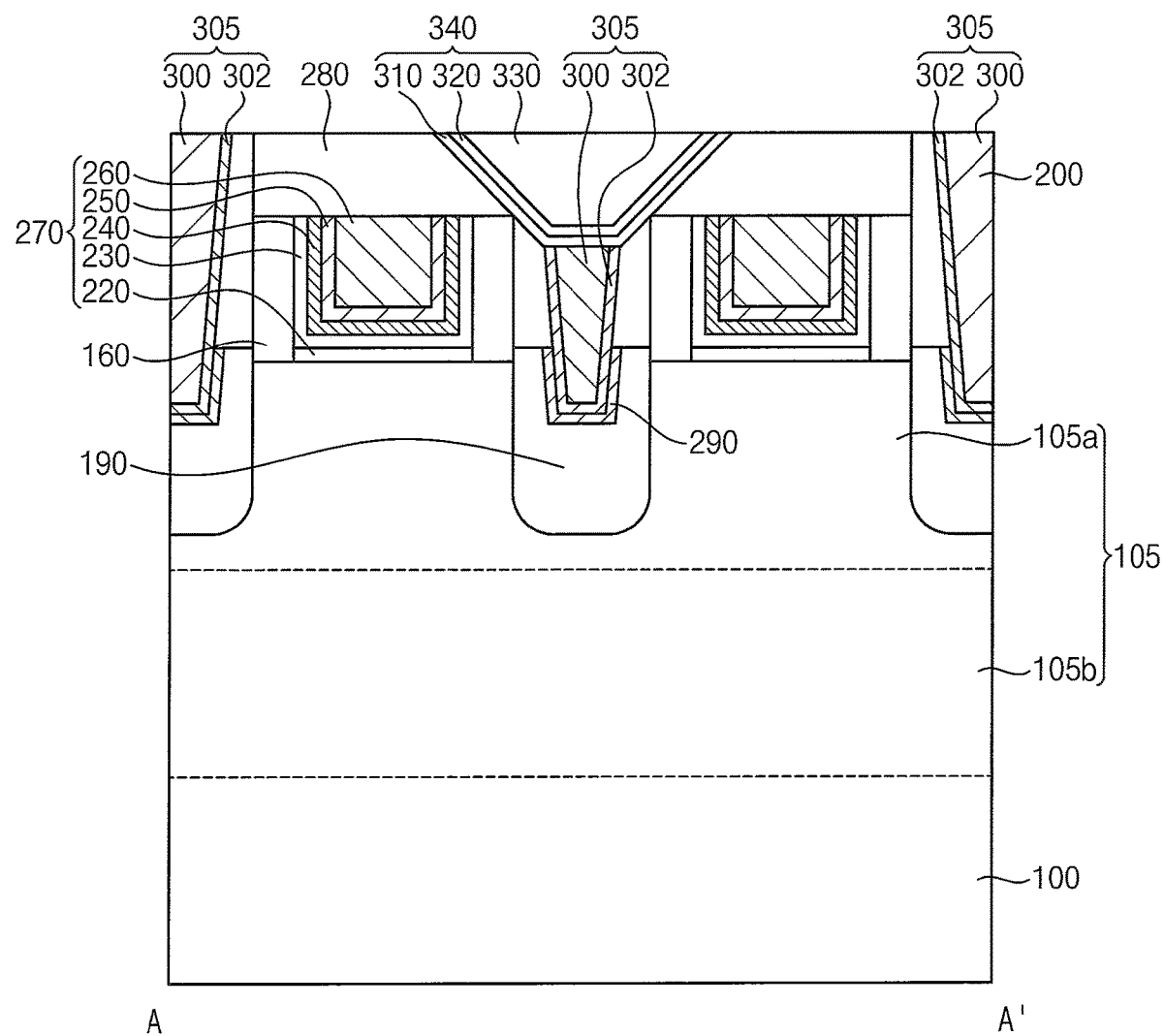

Referring to FIG. 21, a third opening may be formed to expose an upper surface of the first contact plug 305 by removing an upper portion of the first contact plug 305, an upper portion of the first insulating interlayer 200, and a side portion of the capping pattern 280 by an etching process, and the insulation pattern structure 340 may be formed in the third opening.

Particularly, first to third insulation layers may be sequentially formed on the capping pattern 280, the first insulating interlayer 200, and the first contact plug 305 to fill the third opening.

In example embodiments, the first to third insulation layers may be formed by a deposition process, e.g., a CVD process or an ALD process, etc., and the deposition process may be performed by supplying a gas including carbon. Each of the first to third insulation layers may be formed by supplying gases having different carbon concentrations. A carbon concentration of a gas supplied to form the second insulation layer may be greater than carbon concentrations of gases supplied to form the first and third insulation layers, and the carbon concentration of the gas supplied to form the first insulation layer may not be smaller than the carbon concentration of the gas supplied to form the third insulation layer.

The first and second insulation layers may be planarized until an upper surface of the capping pattern 280, the upper surface of the first insulating interlayer 200, the upper surface of the first contact plug 305 to form first to third insulation patterns 310, 320 and 330. The planarization process may be performed by a CMP process and/or an etch back process.

Referring to FIGS. 1 to 4 again, a second insulating interlayer 350 may be formed on insulation pattern structure 340, the capping pattern 280 and the first contact plug 305. A fourth opening may be formed through the second insulating interlayer 350 and the capping pattern 280 to expose an upper surface of the gate electrode structure by an etching process, and the second contact plug 365 may be disposed in the fourth opening.

In example embodiments, the etching process may be performed by, e.g., dry etching using fluorine (F) and hydrogen (H) as an etching gas. During the etching process, a misalignment may occur and a portion of the upper surface of the insulation pattern structure 340 may also be exposed. Upper surfaces of the first and second insulation patterns 310 and 320 may be exposed, and an upper surface of the third insulation pattern 330 may not be exposed.

In the etching process, the reactivity of the etching gas and carbon may be low, and thus an etch rate of the first insulation pattern 310 having a smaller carbon concentration than that of the second insulation pattern 320 may be faster than an etch rate of the second insulation pattern 320. That is, in the etching process, the first insulation pattern 310 may be etched together and the upper surface of first insulation pattern 310 may be inclined, however, the second insulation pattern 320 may not be etched and some portion of the upper surface of second insulation pattern 320 may remain flat. The upper surface of the third insulation pattern 330 may not be exposed by the etching process, and thus the upper surface of the third insulation pattern 330 may also remain flat.

Even though misalignment occurs in the etching process, as the first insulation pattern 310 is etched together, the fourth opening may be formed to expose the upper surface of the gate electrode structure.

If the first insulation pattern 310 is formed to have a carbon concentration greater than about 7 atom %, the etching rate of the first insulation pattern 310 may be slow. Accordingly, the fourth opening may not be properly formed, and thus the upper surface of the gate electrode structure may not be exposed. If the second insulation pattern 320 is formed to have a carbon concentration smaller than about 10 atom %, the etching rate of the second insulation pattern 320 may be fast. Accordingly, the second contact plug 365 may be formed to be adjacent to the first contact plug 305 in the first direction, and thus an electrical short may occur between the first and second contact plugs 305 and 365.

In example embodiments, the second contact plug 365 may include a second barrier pattern 362 on the bottom and the sidewall of the fourth opening and a second metal pattern 360 filling a remaining portion of the fourth opening.

A fifth opening may be formed through the second insulating interlayer 350 to expose the upper surface of the first contact plug 305 by an etching process, and the third contact plug 375 may be disposed in the fifth opening. Thus, the fabrication of the semiconductor device may be completed.

In example embodiments, the third contact plug 375 may include a third barrier pattern 372 on the bottom and the sidewall of the fifth opening and a third metal pattern 370 filling a remaining portion of the fifth opening.

As described above, during the etching process to form the fourth opening, misalignment may occur, and the first insulation pattern 310 having a small carbon concentration may be etched together, however, the second insulation pattern 320 having a great carbon concentration may not be etched. That is, as the first insulation pattern 310 is etched together in the etching process, even though misalignment occurs, the fourth opening may be formed to expose the upper surface of the gate electrode structure. In the etching process, as the second insulation pattern 320 is not etched, a sufficient separation distance between the first and second contact plugs 305 and 365 may be secured, and thus the electric short may not occur therebetween.

Even though a portion of the first insulation pattern 310 is etched and a dielectric constant of the second insulation pattern 320 is increased due to a high carbon concentration, the insulation pattern structure 340 may still have a low dielectric constant by including the third insulation pattern 330 having a low carbon concentration. Accordingly, the insulation pattern structure 340 may have sufficient insulation characteristics to prevent the electrical short between the first and second contact plugs 305 and 365.

Figure 22:
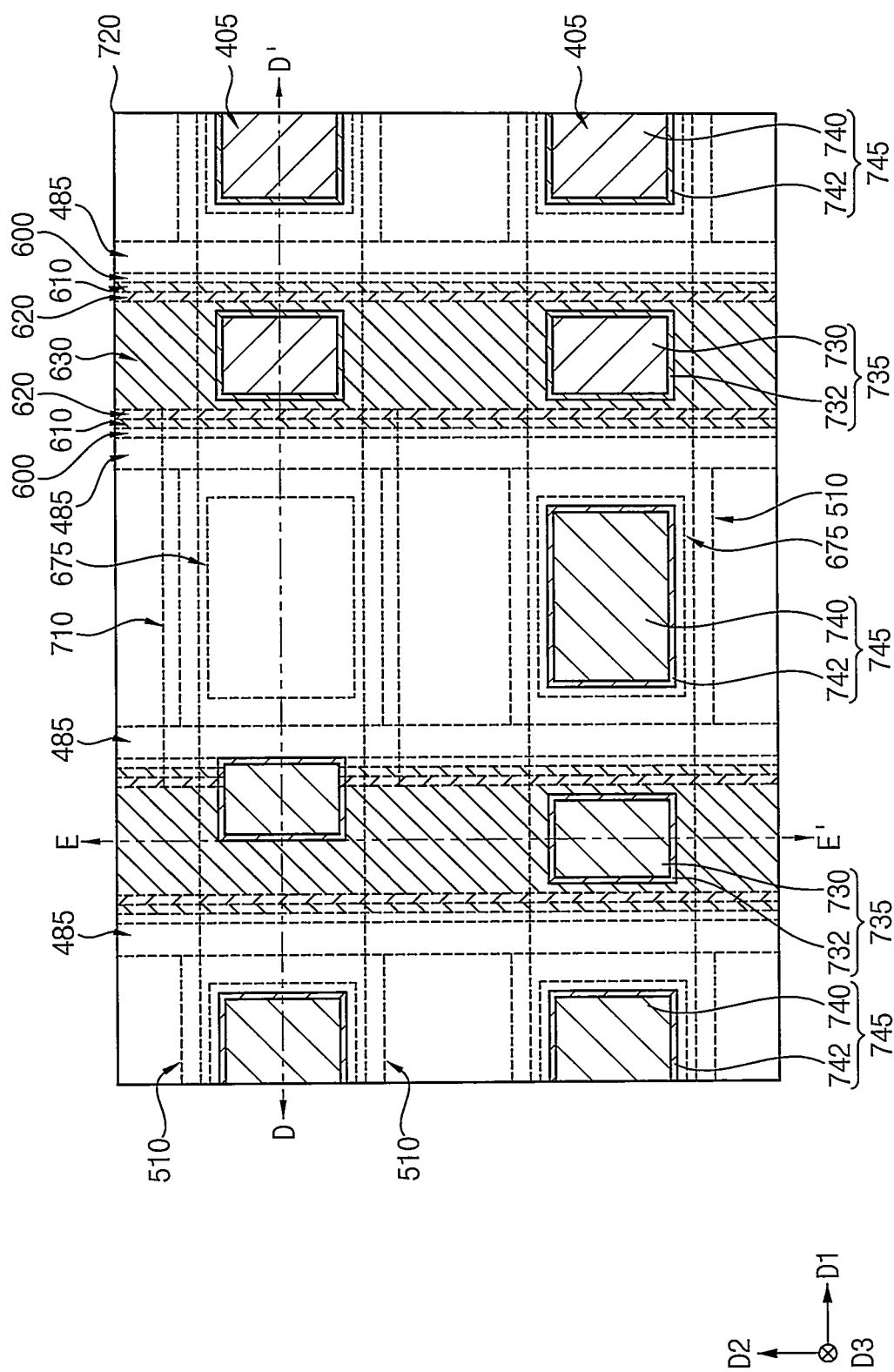
FIG. 22 is a plan view of a semiconductor device according to an embodiment.
Figure 23:
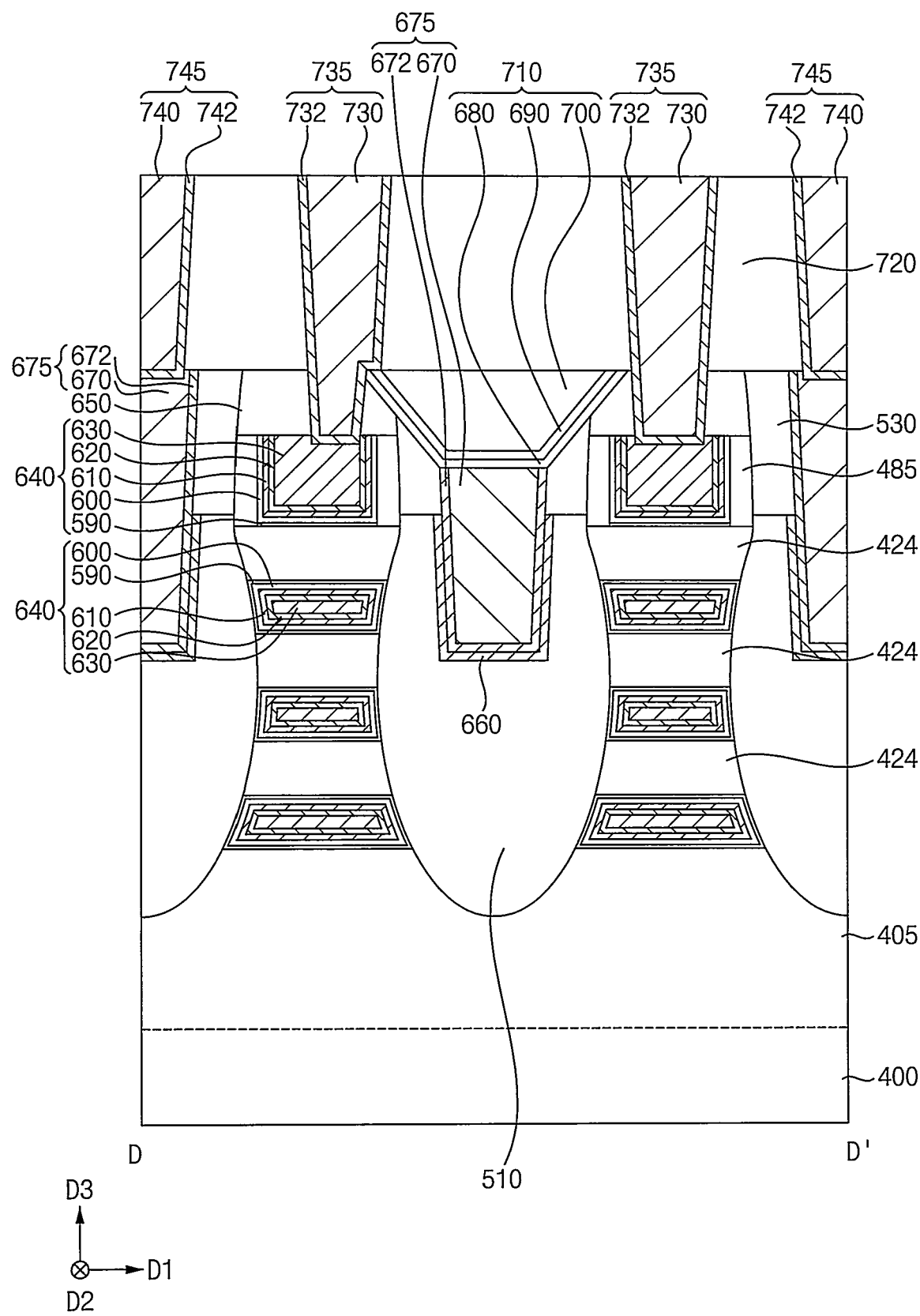
FIG. 23 is a cross-sectional view of a semiconductor device taken along a line D-D' in FIG. 22, according to an embodiment.
Figure 24:
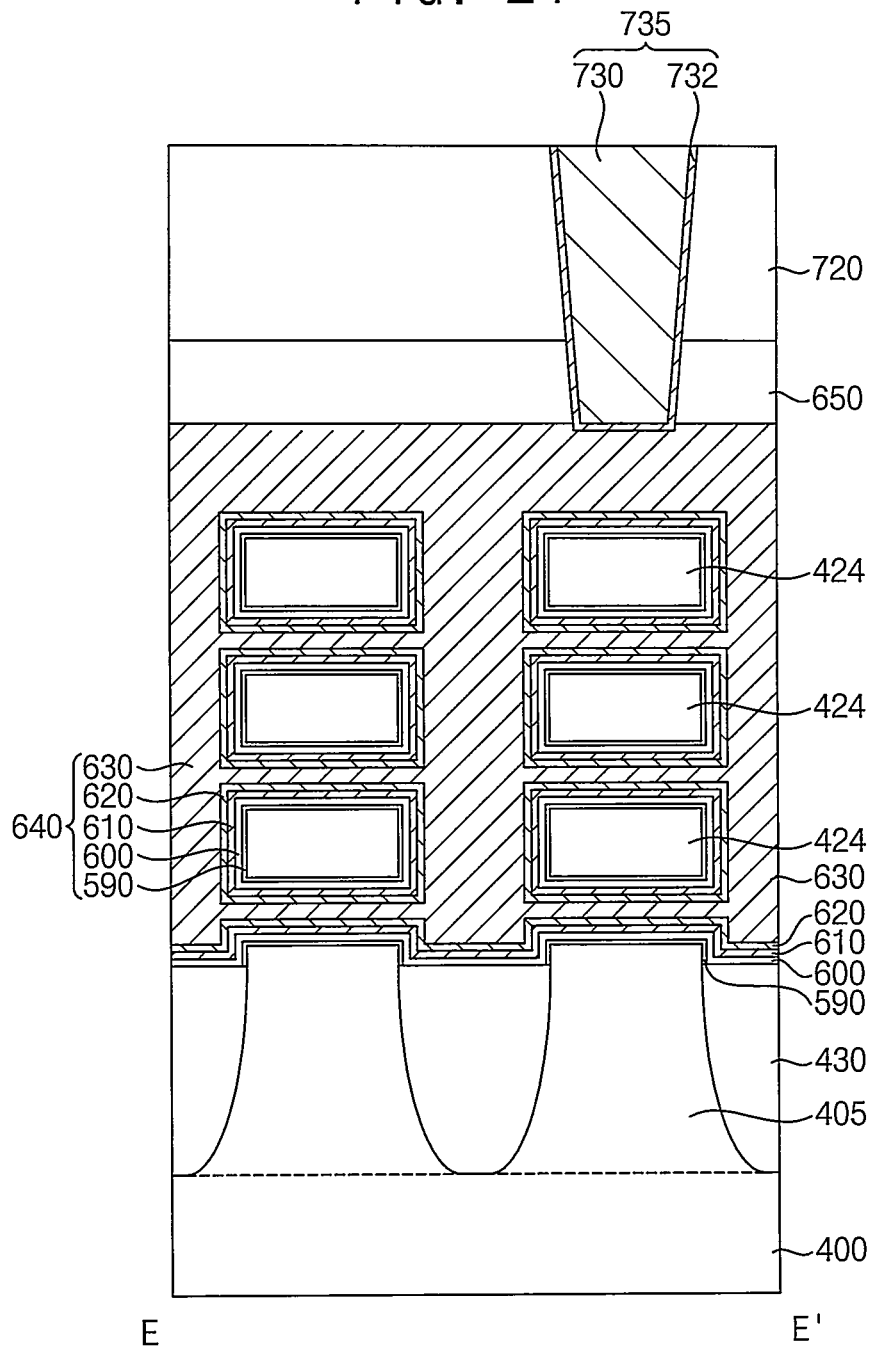
FIG. 24 is a cross-sectional view of a semiconductor device taken along a line E-E' in FIG. 22, according to an embodiment.

FIG. 22 is a plan view of a semiconductor device, FIG. 23 is a cross-sectional view taken along a line D-D' of FIG. 22, and FIG. 24 is a cross-sectional view taken along a line E-E' of FIG. 22. According to this embodiment, a semiconductor device may include elements substantially the same as or similar to those of FIGS. 1 to 4, and thus detailed descriptions thereof are omitted herein.

Referring to FIGS. 22 to 24, the semiconductor device may include an active pattern 405, a semiconductor pattern 424, a gate structure 640, a gate spacer 485, a capping pattern 650, an insulation pattern structure 710, a source and drain layer 510, a first contact plug 675, a second contact plug 735 and a third contact plug 745 disposed above a substrate 400. The semiconductor device may further include an isolation pattern 430, a first insulating interlayer 530, a second insulating interlayer 720 and a metal silicide pattern 660.

The active pattern 405 may protrude from the substrate 400 in the third direction, and may extend in the first direction. Two active patterns 405 are shown in the drawings, however, the inventive concept may not be limited thereto, and more than two active patterns 405 may be spaced apart from each other along the first direction on the substrate 400. The active pattern 405 may be formed by removing an upper portion of the substrate 400, and thus may include the same material as the substrate 400. Each of opposite sidewalls in the second direction of the active pattern 405 may be covered by the isolation pattern 430.

A plurality of semiconductor patterns 424 may be formed at a plurality of levels, respectively, over an upper surface of the active pattern 405 to be spaced apart from each other in the third direction. Three semiconductor patterns 424 are formed at three different height levels in the drawings. However, the inventive concept may not be limited thereto, and there may be more or less than three semiconductor patterns at various height levels. Additionally, two semiconductor patterns 424 may extend in the first direction and may be spaced apart from each other in the first direction at each level on the active pattern 405. However, the inventive concept may not be limited thereto, and more than two semiconductor patterns 424 may be spaced apart from each other in the first direction at each level on the active pattern 405.

In example embodiments, the semiconductor pattern 424 may include nano-sheets or nano-wires containing a semiconductor material, e.g., silicon, germanium, etc. In example embodiments, the semiconductor pattern 424 may serve as a channel of a transistor, and thus may be referred to as a channel.

The gate structure 640 may be formed on the substrate 400 to extend in the second direction, and may be in contact with the semiconductor patterns 424. Thus, the gate structure 640 may be disposed on lower and upper surfaces of each of the semiconductor patterns 424. The gate structure 640 is disposed on the semiconductor patterns 424 on two active patterns 405 extending in the second direction, however, the inventive concept may not be limited thereto. That is, the gate structure 640 may extend in the second direction above the substrate 400 having the isolation pattern 430 thereon, and may cover the semiconductor patterns 424 on more than two active patterns 405 spaced apart from each other in the second direction.

Additionally, two gate structures 640 are formed in the first direction in the drawings, however, the inventive concept may not be limited thereto, and more than two gate structures 640 may be formed in the first direction.

The gate structure 640 may include an interface pattern 590, a gate insulation pattern 600, a gate barrier 610 and a first gate electrode 620 sequentially stacked on a surface of each of the semiconductor patterns 424, an upper surface of the active pattern 405, and a sidewall of the source and drain layer 510.

The interface pattern 590 may be formed on the surface of each of the semiconductor patterns 424, the upper surface of the active pattern 405, and the sidewall of the source and drain layer 510. The gate insulation pattern 600 may be formed on a surface of the interface pattern 590 and an inner sidewall of the gate spacer 485, the gate barrier 610 and the first gate electrode 620 may be sequentially formed on the gate insulation pattern 600, and the second gate electrode 630 may fill a space between the semiconductor patterns 424 spaced apart from each other in the third direction, a space between a lowermost one of the semiconductor patterns 424 and the active pattern 405, and a space between the gate spacers 485 on an uppermost one of the semiconductor patterns 424.

The gate spacer 485 may cover each of opposite sidewalls in the first direction of the gate structure 640 on the uppermost one of the semiconductor patterns 424, and thus may extend in the second direction.

The capping pattern 650 may be disposed on upper surfaces of the gate structure 640 and the gate spacer 485. The capping pattern 650 may extend in the second direction.

The source and drain layer 510 may be formed between the gate structures 640 on the active pattern 405 of the substrate 400, and may commonly contact each sidewall of the semiconductor patterns 424 at a plurality of levels. An upper portion of the source and drain layer 510 may be in contact with an outer sidewall of the gate spacer 485.

In an example embodiment, the source and drain layer 510 may include single crystalline silicon-germanium doped with p-type impurities, and thus may form a PMOS transistor together with the gate structure 640, the source and drain layer 510 and each of the semiconductor patterns 424 serving as a channel. A plurality of semiconductor patterns 424 may be spaced apart from each other in the third direction, and thus the semiconductor device may be a multi-bridge channel field effect transistor (MBCFET).

Alternatively or additionally, the source and drain layer 510 may include single crystalline silicon doped with n-type impurities or single crystalline silicon carbide doped with n-type impurities, and thus may form a PMOS transistor together with the gate structure 640, the source and drain layer 510 and each of the semiconductor patterns 424 serving as a channel. A plurality of semiconductor patterns 424 may be spaced apart from each other in the third direction, and thus the semiconductor device may be an MBCFET.

Referring to FIG. 23, the first insulating interlayer 530 may be formed on the active pattern 405 of the substrate 400 and the isolation pattern 430, and may cover a sidewall of the gate spacer 485 on each of opposite sidewalls of the gate structure 640, a sidewall of the capping pattern 650 and an upper surface of the source and drain layer 510.

The first contact plug 675 may extend through the first insulating interlayer 530 between the first gate structures 640 spaced apart from each other in the first direction to contact an upper surface of the source and drain layer 510. In example embodiments, the first contact plug 675 may include a first metal pattern 670 and a first barrier pattern 672 covering a lower surface and a sidewall of the first metal pattern 670.

In example embodiments, the first contact plug 675 may not contact a sidewall of the gate structures 640, and the first insulating interlayer 530 may be formed between the sidewall of the gate structures 640 and the first contact plug 675.

In example embodiments, an upper surface of the first contact plug 675 may be substantially the same as an upper surface of the capping pattern 650. The first contact plug 675 may extend through the first insulating interlayer 530, and thus the upper surface of the first contact plug 675 and the upper surface of the capping pattern 650 may be formed at substantially the same height as each other.

The metal silicide pattern 660 may be disposed between the first contact plug 675 and the upper surface of the source and drain layer 510. Specifically, the metal silicide pattern 660 may be disposed between the upper surface of the source and drain layer 510, and a lower surface and sidewalls of the first contact plug 675.

The insulation pattern structure 710 may be disposed on the first contact plug 675, and may include first to third insulation patterns 680, 690 and 700 sequentially stacked in the third direction.

In example embodiments, portions of the first insulation pattern 680 and the second insulation pattern 690 may be inclined, and an upper surface of the third insulation pattern 700 may be flat.

The second insulating interlayer 720 may be disposed on the first insulating interlayer 530, the capping pattern 650 and the insulation pattern structure 710.

The second contact plug 735 may be formed on the gate structure 640. The second contact plug 735 may pass through the second insulating interlayer 720 and the capping pattern 650. The second contact plug 735 may be disposed such that the lowermost surface of the second contact plug 735 is in contact with an upper surface of the gate structure 640.

In example embodiments, the second contact plug 735 may be misaligned and formed on the insulation pattern structure 710. The second contact plug 735 may contact an upper surface of the insulation pattern structure 710. The second contact plug 735 may contact upper surfaces of the first and second insulation patterns 680 and 690 of the insulation pattern structure 710.

An upper surface of the second contact plug 735 may be higher than upper surface of the first contact plug 675.

The third contact plug 745 may extend through the second insulating interlayer 720 to contact the upper surface of the first contact plug 675.

In example embodiments, the second contact plug 735 may include a second metal pattern 730 and a second barrier pattern 732 covering a lower surface and a sidewall of the second metal pattern 730, and the third contact plug 745 may include a third metal pattern 740 and a third barrier pattern 742 covering a lower surface and a sidewall of the third metal pattern 740.

The second and third contact plugs 735 and 745 may have various types of layouts and shapes in addition to the layout shown in the drawings.

As illustrated with reference to FIGS. 1 to 4, the second contact plug 735 may be misaligned and may also be formed on a portion of the insulation pattern structure 710. However, the insulation pattern structure 710 including a low-k dielectric material may be formed on the first contact plug 675, and thus the electric short may not occur between the first and second contact plugs 675 and 735. Accordingly, electrical characteristics of the semiconductor device including the insulation pattern structure 710 may be improved.

FIGS. 25 to 37 are plan views and cross-sectional views illustrating a method of manufacturing a semiconductor device according to embodiments. Particularly, FIGS. 25, 27, 30 and 34 are the plan views, and FIGS. 26, 28-29, 31-33 and 35-37 are the cross-sectional views.

Figure 29:
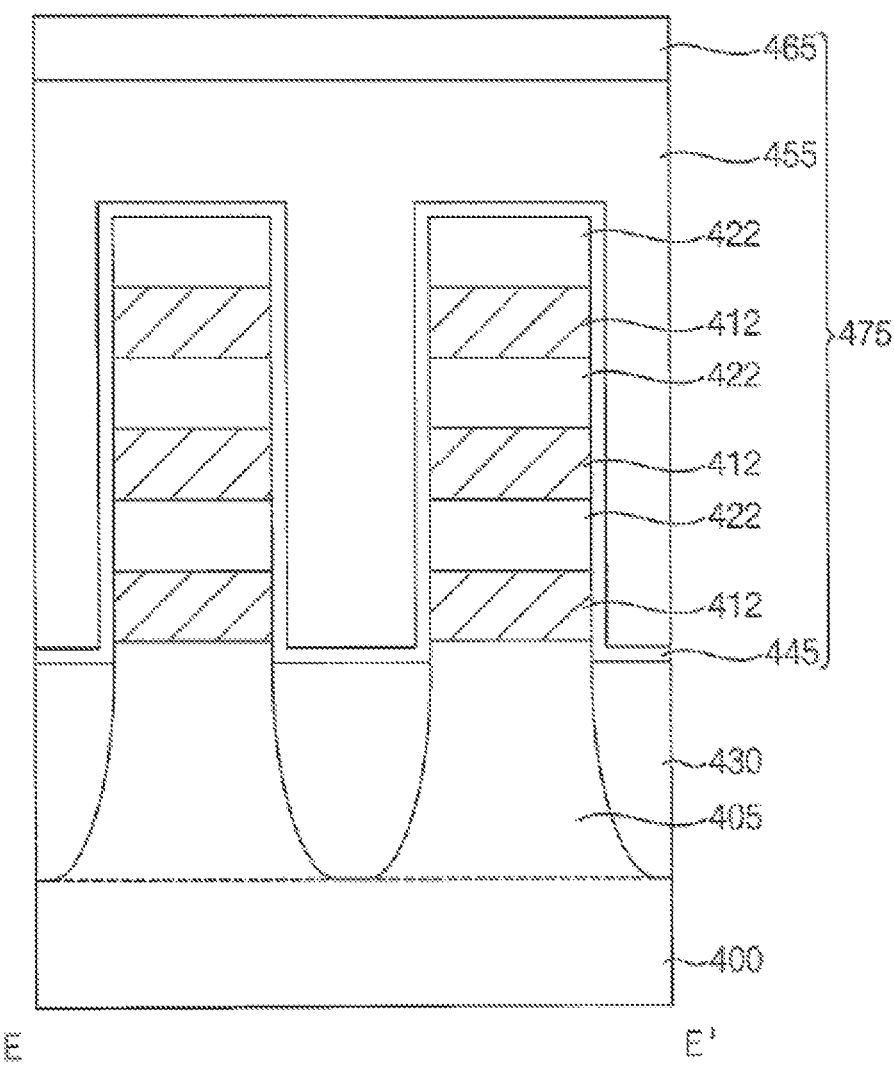

FIGS. 28, 31-33 and 35-37 are cross-sectional views taken along lines D-D' of corresponding plan views, and FIGS. 26 and 29 are cross-sectional views taken along lines E-E' of corresponding plan views.

The method according to this embodiment may include processes substantially the same as or similar to those illustrated with reference to FIGS. 5 to 21 and FIGS. 1 to 4, and thus repeated descriptions thereon are omitted herein.

Figure 25:
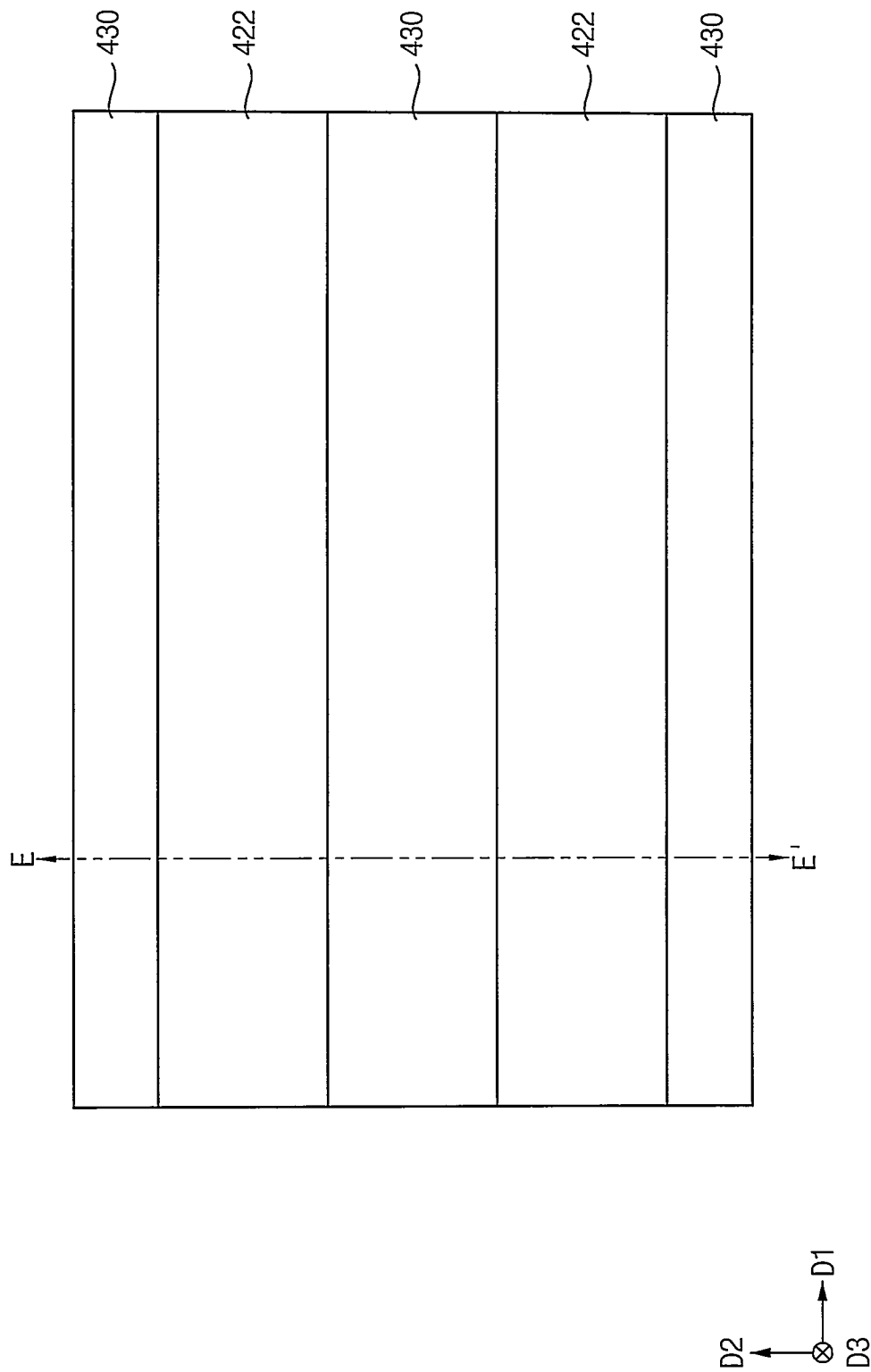

Referring to FIGS. 25 and 26, a sacrificial layer and a semiconductor layer may be alternately and repeatedly stacked on a substrate 400, an etching mask extending in the first direction may be formed on an uppermost one of the semiconductor layers, and the semiconductor layers, the sacrificial layers and an upper portion of the substrate 400 may be etched using the etching mask.

Thus, an active pattern 405 may be disposed on the substrate 400 and extend in the first direction. A fin structure may be disposed on the active pattern 405 and may include sacrificial lines 412 and semiconductor lines 422 alternately and repeatedly stacked. In example embodiments, a plurality of fin structures may be spaced apart from each other in the second direction on the substrate 400.

Three sacrificial lines 412 and three semiconductor lines 422 are alternately and repeatedly stacked in the drawings, however, the inventive concept may not be limited thereto. The sacrificial lines 412 may include a material having an etching selectivity with respect to the substrate 400 and the semiconductor lines 422.

An isolation pattern 430 may be disposed on the substrate 400 and a sidewall of the active pattern 405.

Figure 27:
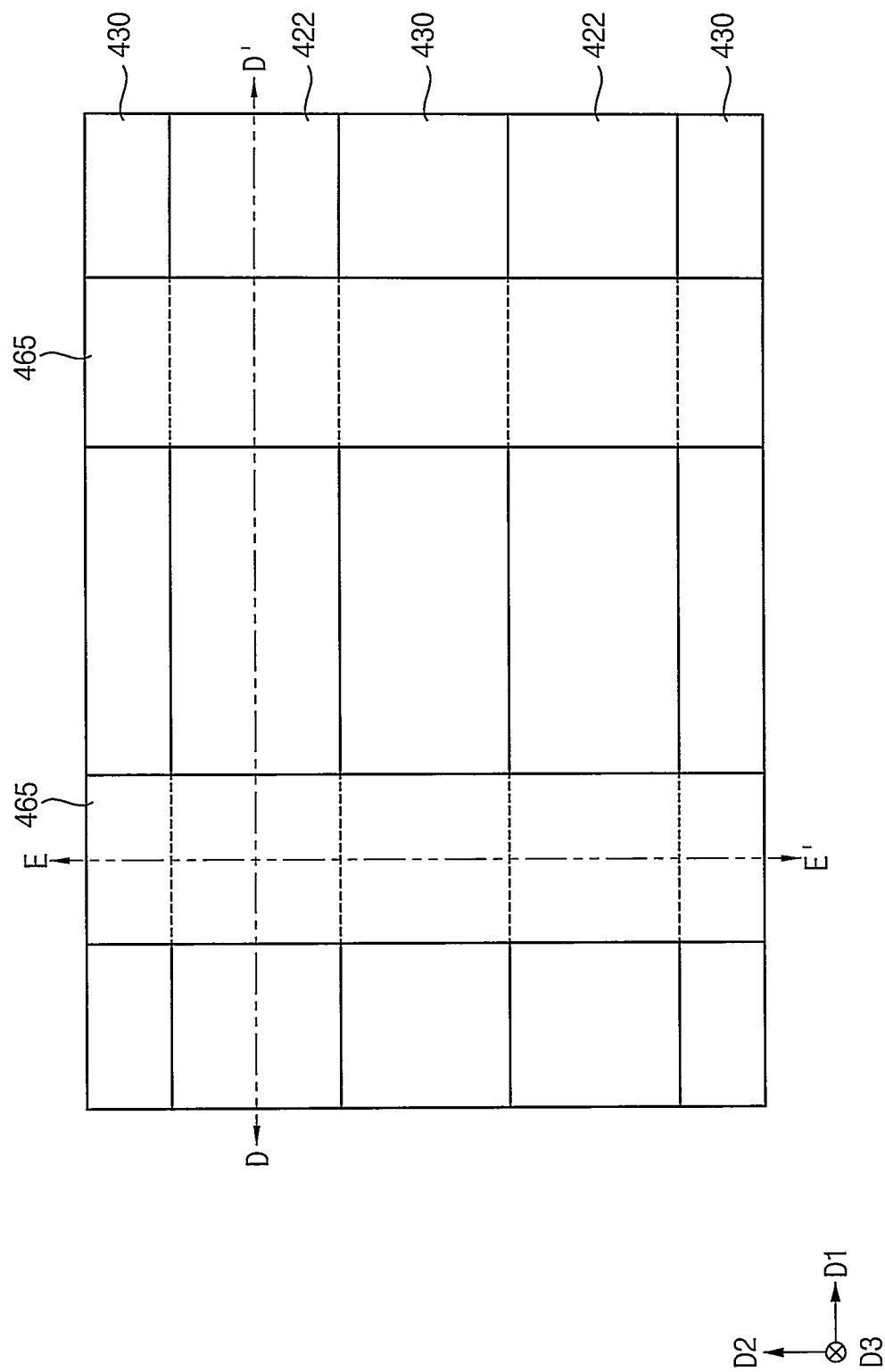

Referring to FIGS. 27 to 29, a dummy gate structure 475 may be disposed above the substrate 400 to partially cover the fin structure and the isolation pattern 430.

Particularly, a dummy gate insulation layer, a dummy gate electrode layer and a dummy gate mask layer may be sequentially formed on the fin structure and the isolation pattern 430. For example, an etching mask extending in the second direction may be formed over the dummy gate mask layer, and the dummy gate mask layer may be etched using the etching mask to form a dummy gate mask 465.

The dummy gate electrode layer and the dummy gate insulation layer may be etched using the dummy gate mask 465 as an etching mask to form a dummy gate electrode 455 and a dummy gate insulation pattern 445.

The dummy gate insulation pattern 445, the dummy gate electrode 455 and the dummy gate mask 465 sequentially stacked on the active pattern 405 and a portion of the isolation pattern 430 adjacent thereto may form a dummy gate structure 475. In example embodiments, the dummy gate structure 475 may extend in the second direction on the fin structure and the isolation pattern 430, and may cover an upper surface and opposite sidewalls in the second direction of the fin structure.

Figure 30:
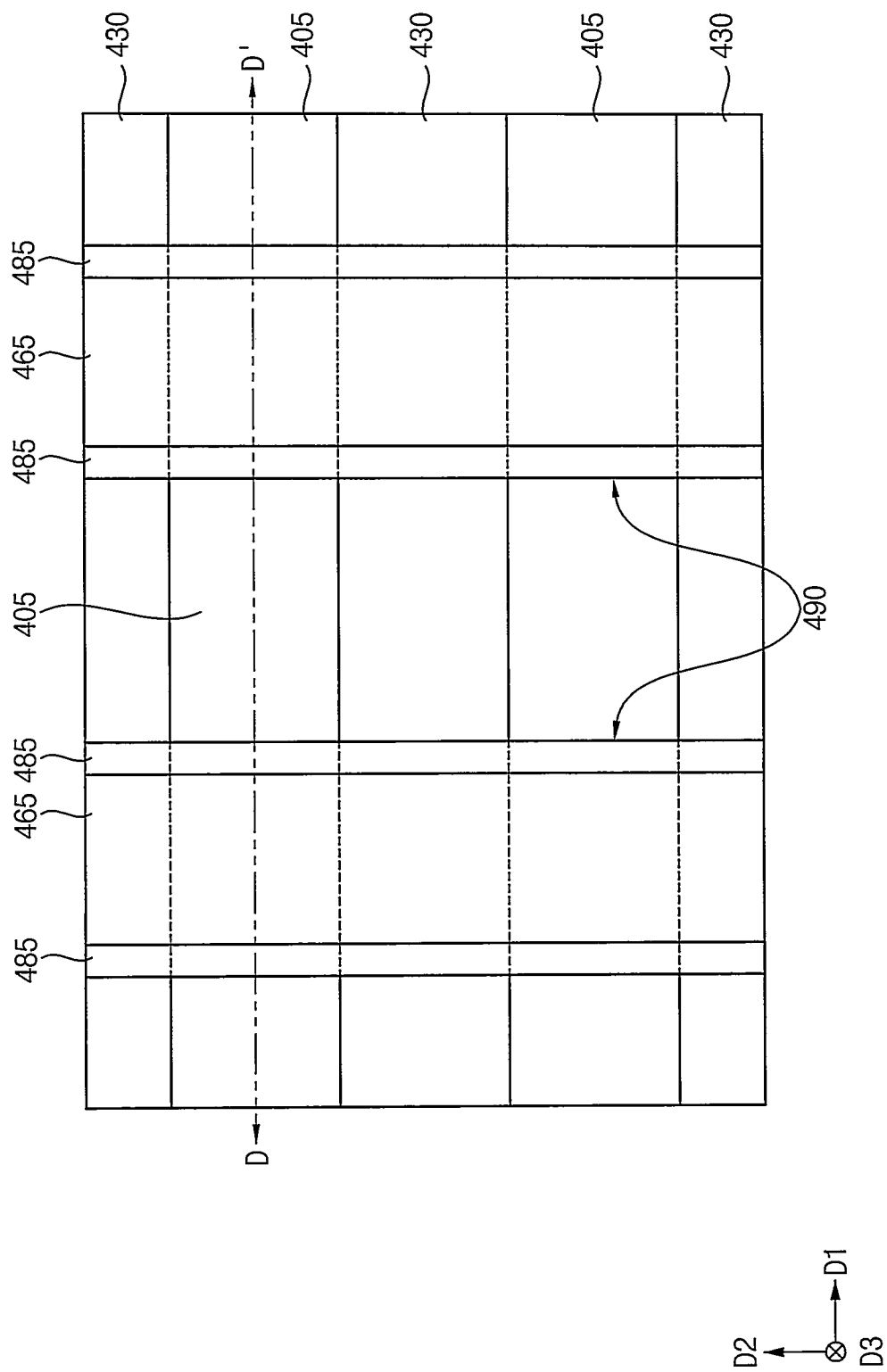
Figure 31:
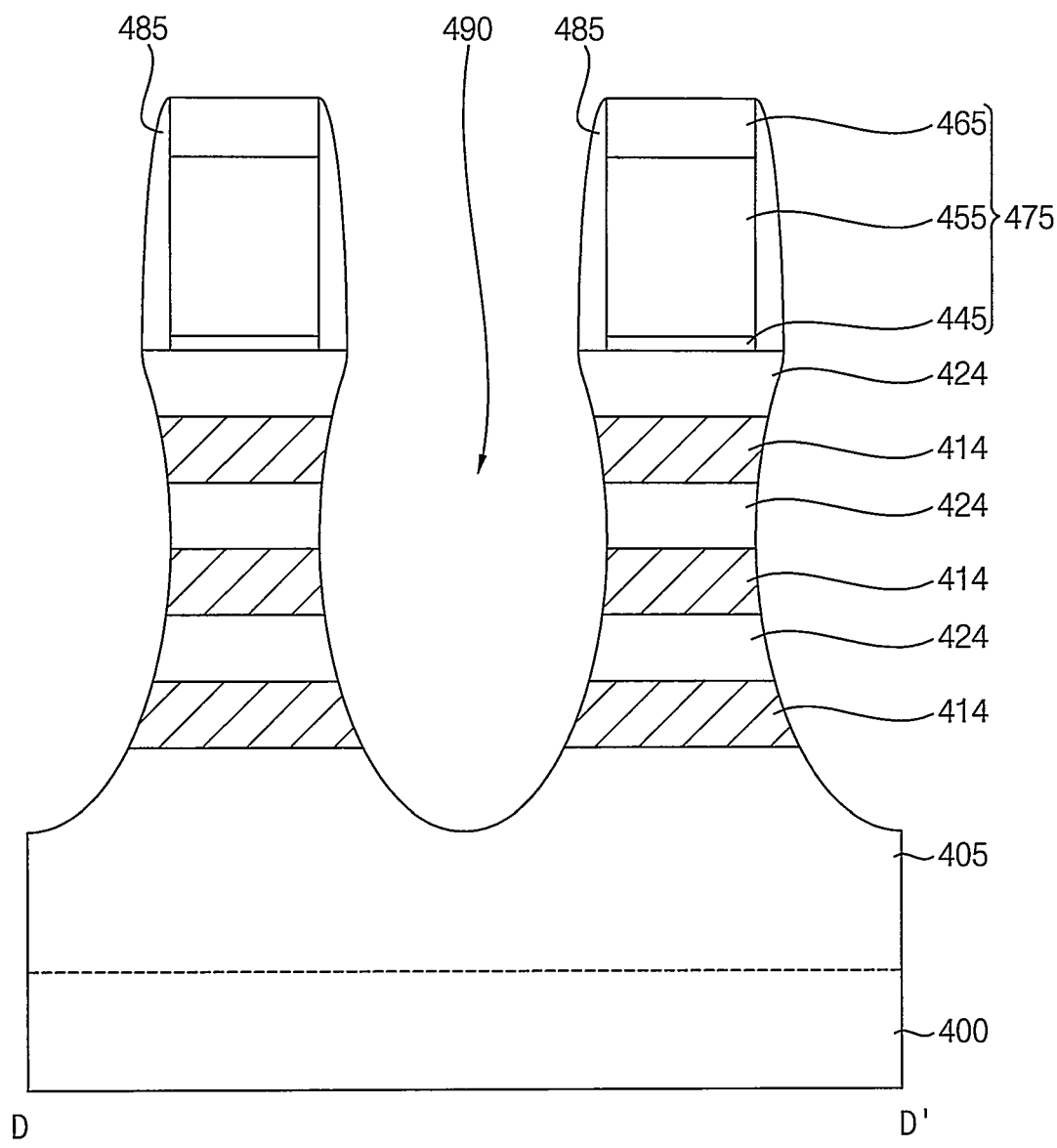

Referring to FIGS. 30 and 31, a gate spacer 485 may be formed on a sidewall of the dummy gate structure 475.

Particularly, a spacer layer may be formed on the fin structure, the isolation pattern 430 and the dummy gate structure 475 and anisotropically etched to form the gate spacer 485 covering each of opposite sidewalls of the dummy gate structure 475 in the first direction.

The fin structure and an upper portion of the active pattern 405 may be etched using the dummy gate structure 475 and the gate spacer 485 as an etching mask to form a third opening 490.

Thus, the sacrificial lines 412 and the semiconductor lines 422 (shown in FIG. 29) disposed below the dummy gate structure 475 and the gate spacer 485 may be transformed into sacrificial patterns 414 and semiconductor patterns 424, and the fin structure extending in the first direction may be divided into a plurality of pieces spaced apart from each other in the first direction.

Hereinafter, the dummy gate structure 475, the gate spacers 485 on opposite sidewalls of the dummy gate structure 475 in the first direction, and the fin structure may be referred to as a first structure. In example embodiments, the first structure may extend in the second direction, and a plurality of first structures may be spaced apart from each other in the first direction.

In an example embodiment, the third opening 490 may be formed to have a maximum volume. A sidewall of the third opening 490 may have a convex shape. Sidewalls of the semiconductor patterns 424 in the first direction may not be perpendicular, but may be slanted with respect to an upper surface of the substrate 400. Thus, lengths of the semiconductor patterns 424 at different levels may not be constant in the first direction. Also, heights of the semiconductor patterns 424 may be variously configured.

Alternatively or additionally, the sidewall of the third opening 490 may be substantially perpendicular with respect to the upper surface of the substrate 400, and the lengths of the semiconductor patterns 424 in the first direction may be constant. In such a case, the sidewall of the third opening 490 may not have a convex shape, and may have a rectangular shape.

Figure 32:
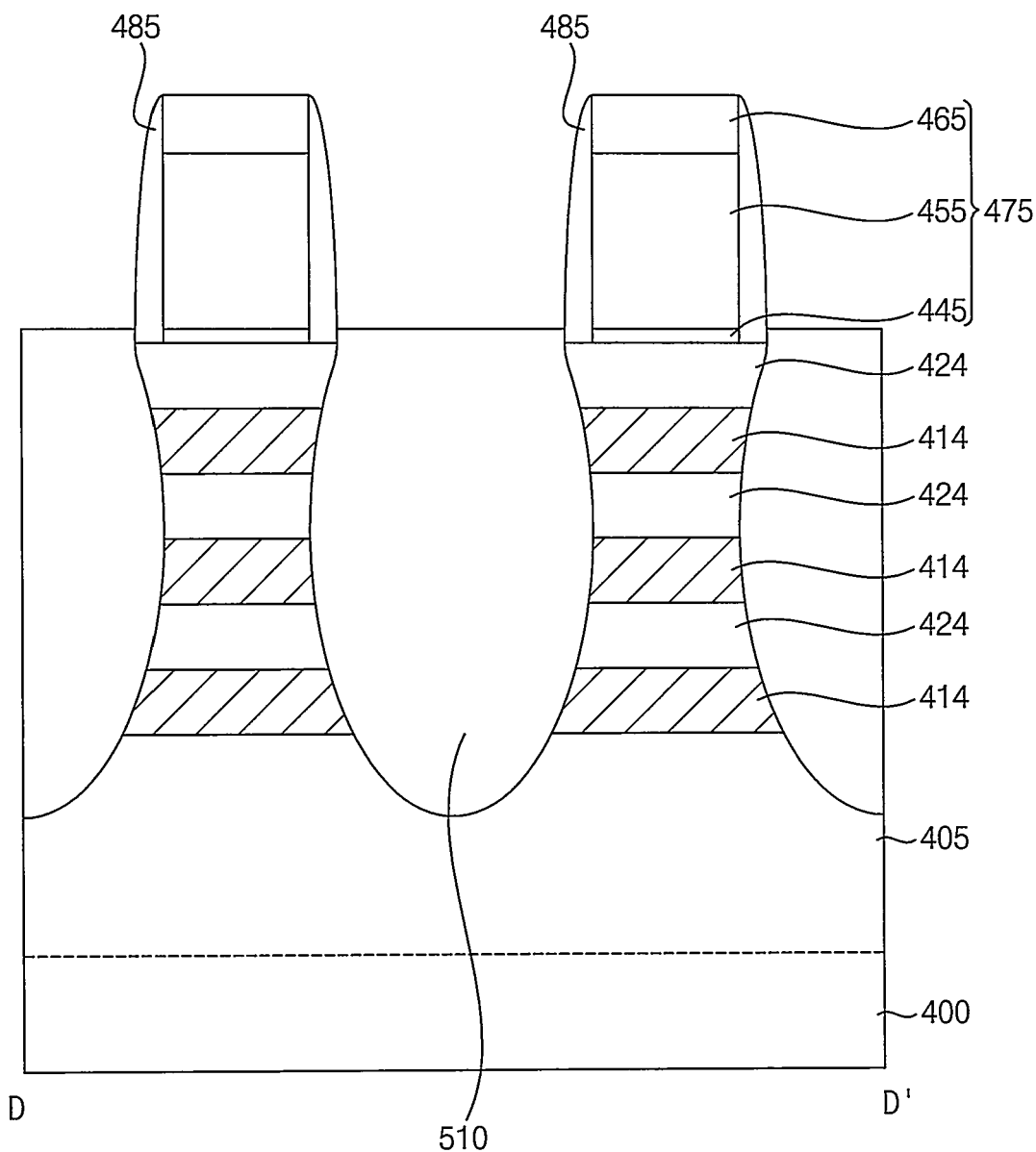

Referring to FIG. 32, a SEG process may be performed using sidewalls of the semiconductor patterns 424 and the sacrificial patterns 414 and the upper surface of the active pattern 405 exposed by the third opening 490 as a seed to form a source and drain layer 510 on an inner wall of the third opening 490.

In an example embodiment, the SEG process may be performed using a silicon source gas, e.g., dichlorosilane ($SiH_2Cl_2$) gas, a germanium source gas, e.g., germane ($GeH_4$) gas, and a p-type impurity source gas, e.g., diborane ($B_2H_6$) gas, so that a single crystalline silicon-germanium layer doped with p-type impurities may be formed as the source and drain layer 510. In an example embodiment, an upper portion of the source and drain layer 510 may contact an outer sidewall of the gate spacer 485.

Alternatively or additionally, the SEG process may be performed using a silicon source gas, e.g., disilane ($Si_2H_6$) gas and n-type impurity source gas, e.g., $PH_3$, $POCl_3$, $P_2O_5$, so that a single crystalline silicon layer doped with n-type impurities may be formed as the source and drain layer 510.

Referring to FIG. 41, a first insulating interlayer 530 may be formed above the substrate 400 to cover the first structure and the source and drain layer 510, and may be planarized until the dummy gate electrode 455 of the first structure is exposed. During the planarization process, the dummy gate mask 465 may be also removed, and an upper portion of the gate spacer 485 may be partially removed.

Figure 33:
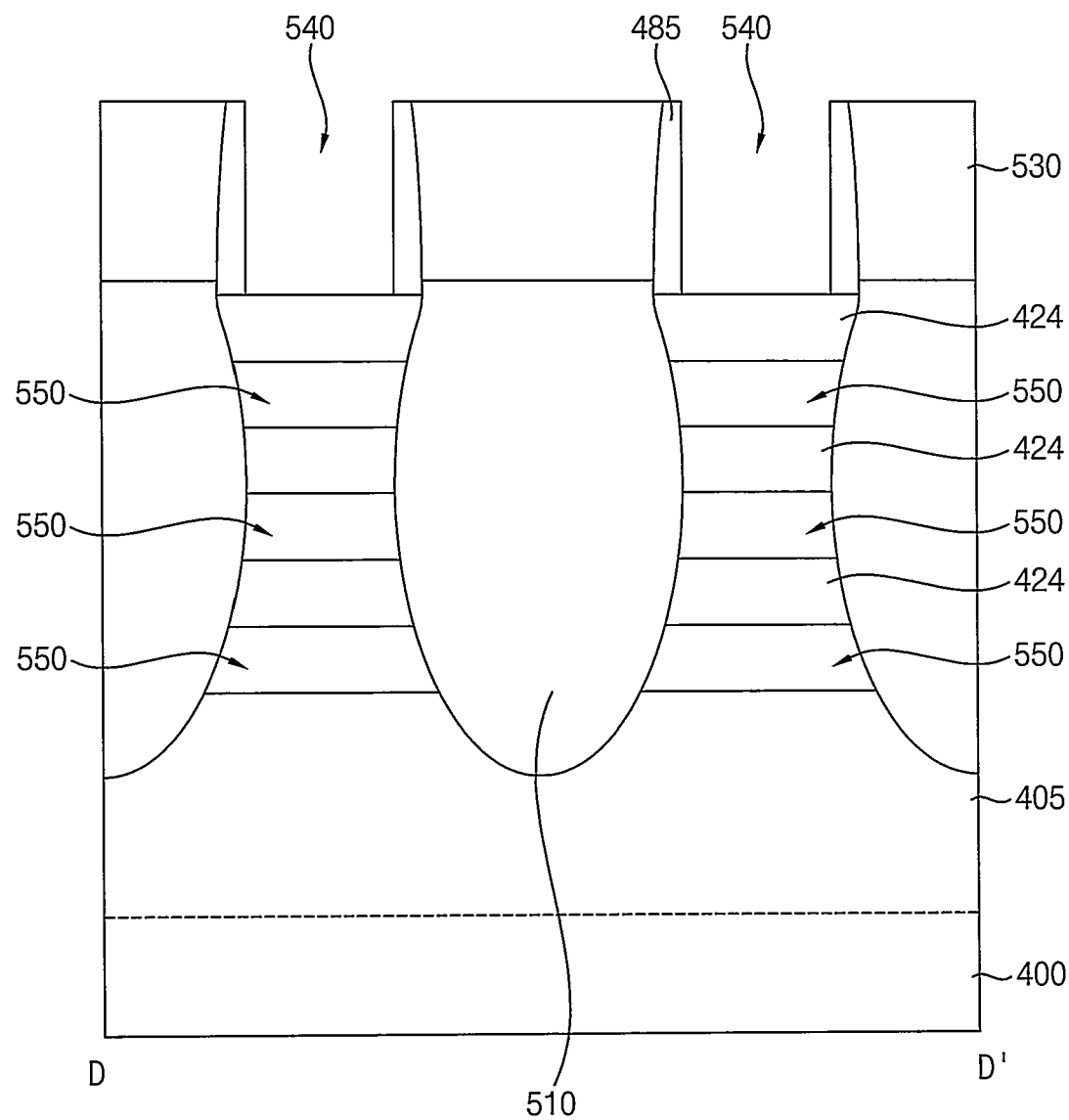
Figure 34:
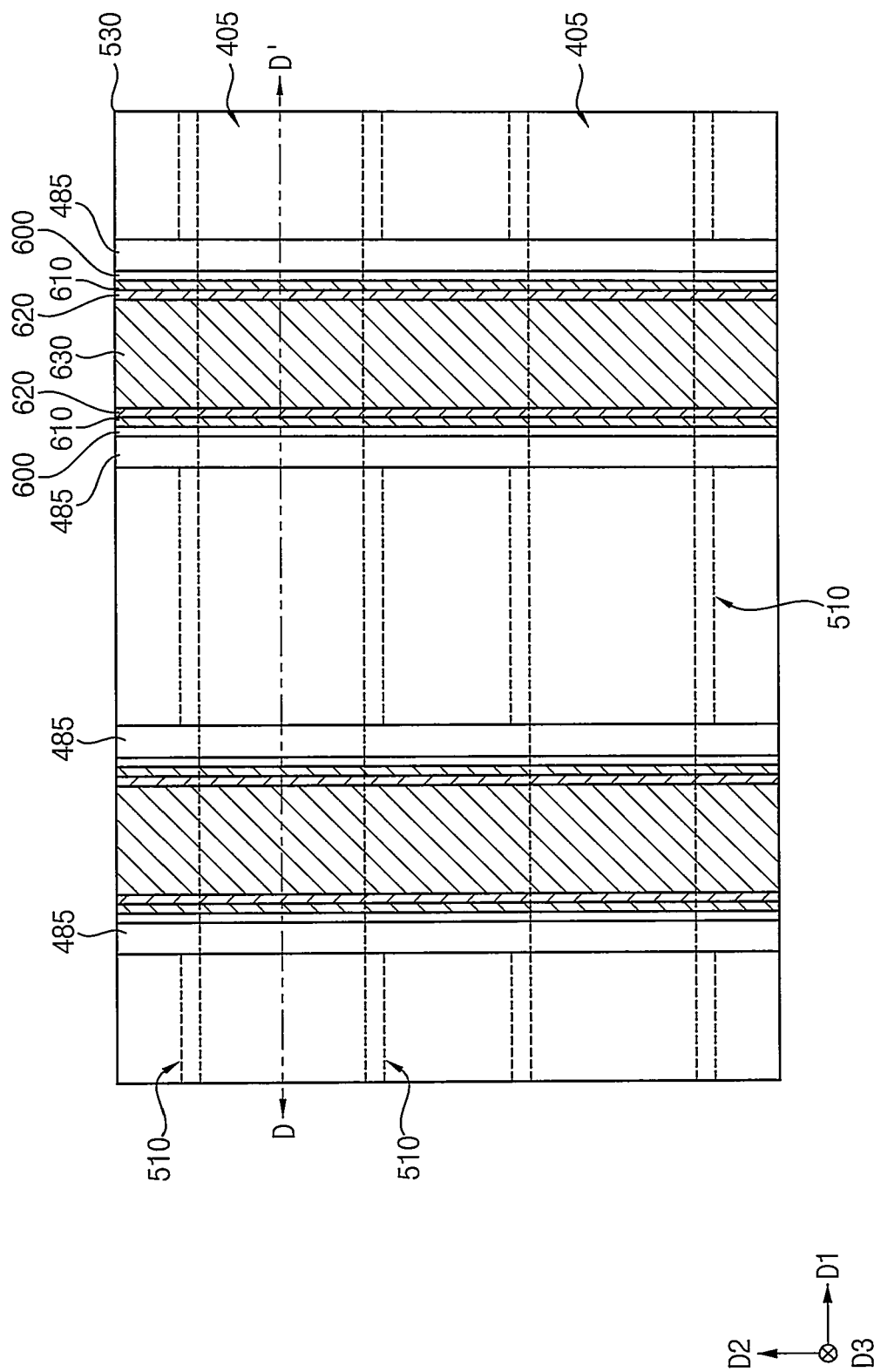

Referring to FIG. 33, the exposed dummy gate electrode 455, the dummy gate insulation pattern 445 and the sacrificial patterns 414 may be removed by, e.g., a wet etching process and/or a dry etching process to form a fourth opening 540 exposing an inner sidewall of the gate spacer 485 and an upper surface of an uppermost one of the semiconductor patterns 424. A fifth opening 550 may be formed to expose a sidewall of the source and drain layer 510, surfaces of the semiconductor patterns 424 and an upper surface of the active pattern 405.

Figure 35:
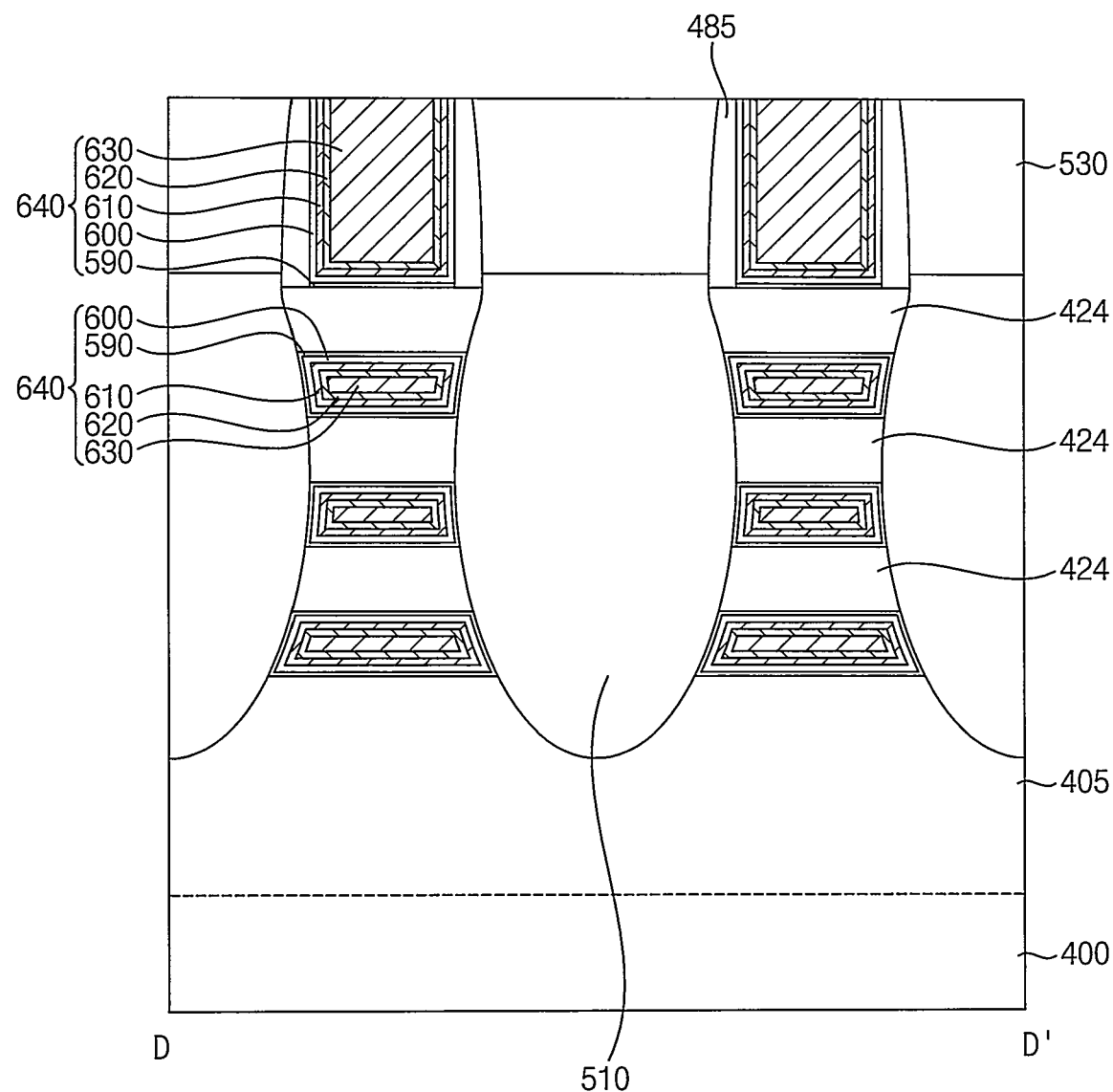
Figure 36:
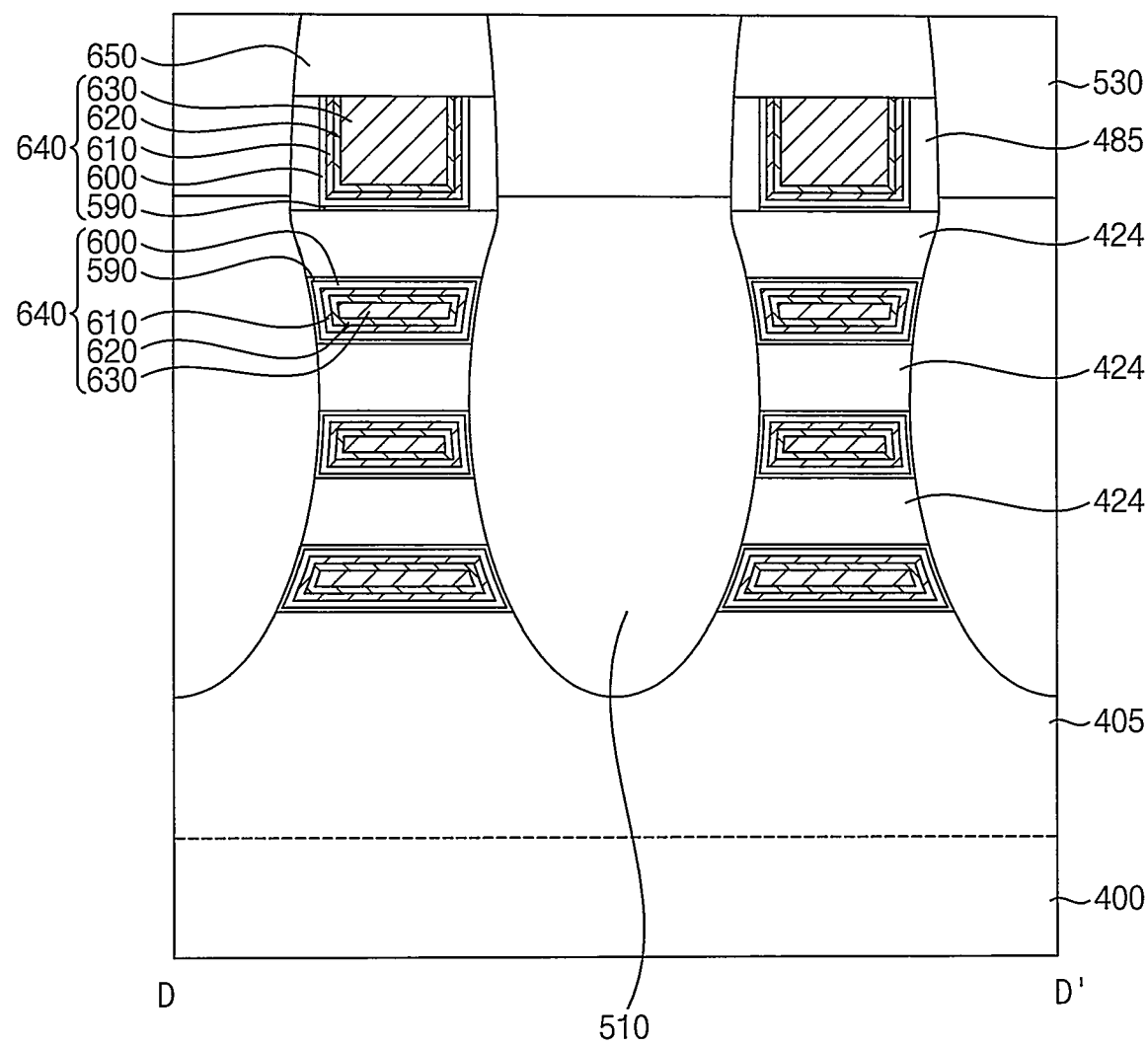

Referring to FIGS. 35 and 36, a gate structure 640 may be disposed on the semiconductor patterns 424 by filling the fourth and fifth openings 540 and 550.

Specifically, a thermal oxidation process may be performed on the upper surface of the active pattern 405, the surfaces of the semiconductor patterns 424 and the sidewall of the source and drain layer 510 exposed by the fourth and fifth openings 540 and 550 to form an interface pattern 590, a gate insulation layer, a gate barrier layer and a first gate electrode layer may be sequentially and conformally formed on a surface of the interface pattern 590, an inner sidewall and an upper surface of the gate spacer 485 and an upper surface of the first insulating interlayer 530, and a second gate electrode layer may be formed to fill remaining portions of the fourth and fifth openings 540 and 550.

The gate insulation layer, the gate barrier layer, and the first and second gate electrode layers may be formed by, e.g., a CVD process, an ALD process, a PVD process, etc. In some embodiments, the interface pattern 590 may be formed by a CVD process, an ALD process, etc., instead of the thermal oxidation process, and may be also formed on the inner sidewall and the upper surface of the gate spacer 485 and the upper surface of the first insulating interlayer 530.

The first and second gate electrode layers, the gate barrier layer and the gate insulation layer may be planarized until the upper surface of the first insulating interlayer 530 is exposed, so that first and second gate electrodes 620 and 630, a gate barrier 610, and a gate insulation pattern 600 may be formed. The interface pattern 590, the gate insulation pattern 600, the gate barrier 610, and the first and second gate electrodes 620 and 630 may form the first gate structure 640, and the first and second gate electrodes 620 and 630 may form a gate electrode structure.

Referring to FIG. 36, processes substantially the same as or similar to those illustrated with reference to FIG. 18 may be performed, so that a fourth recess may be formed on the gate structure 640 and the gate spacer 485, a capping layer may be formed to fill the fourth recess, and the capping layer may be planarized until the upper surface of the first insulating interlayer 530 is exposed to form the capping pattern 650.

Figure 37:
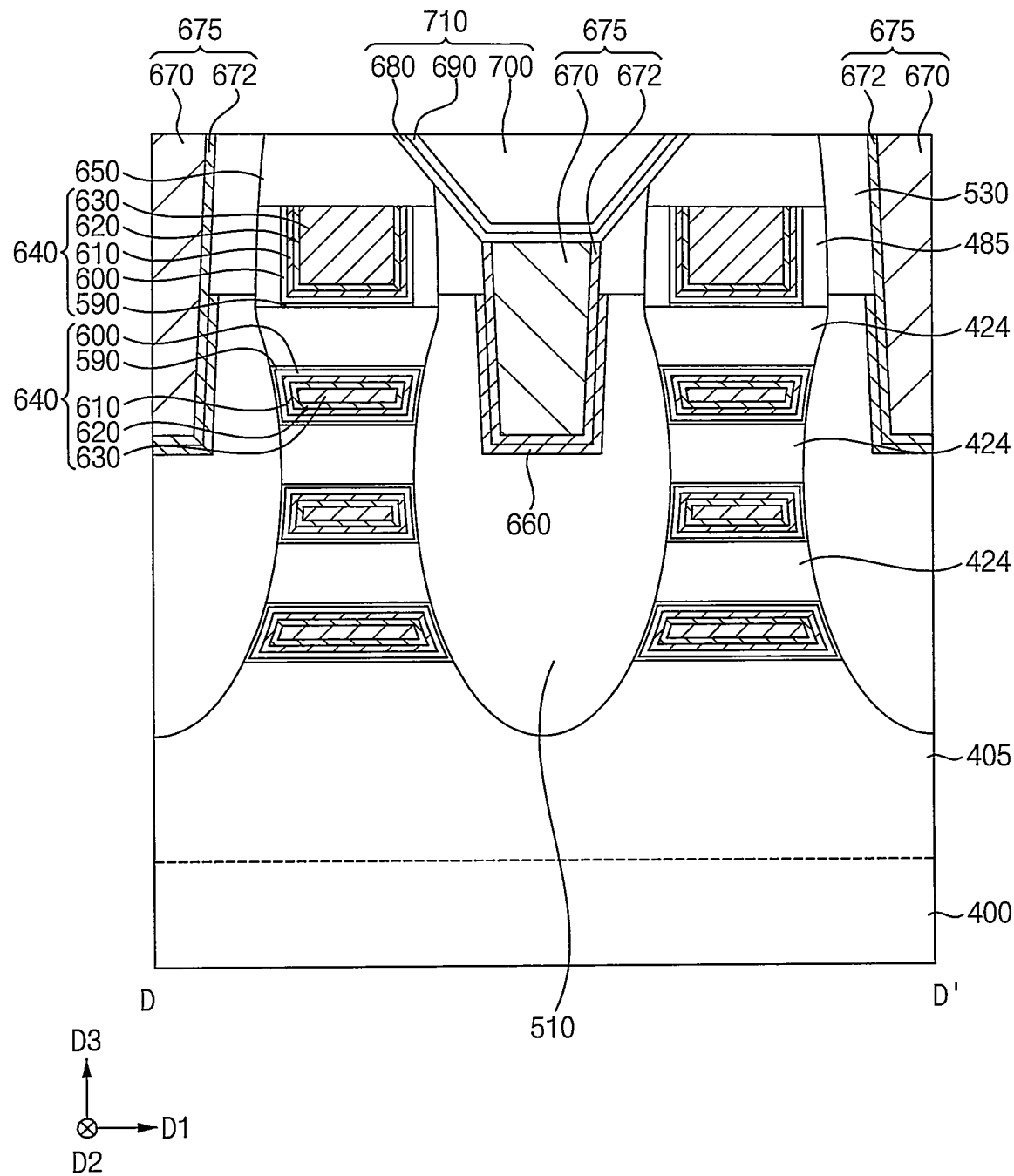

Referring to FIG. 37, processes substantially the same as or similar to those illustrated with reference to FIGS. 19 to 21 may be performed, so that a first contact plug 675 may be formed through the first insulating interlayer 530 to contact an upper surface of the source and drain layer 510.

Before forming the first contact plug 675, a silicidation process may be further performed to form a metal silicide pattern 660 on the upper surface of the source and drain layer 510.

A sixth opening may be formed to expose an upper surface of the first contact plug 675 removing an upper portion of the first contact plug 675, an upper portion of the first insulating interlayer 530, and a side portion of the capping pattern 650 by an etching process, and the insulation pattern structure 710 may be formed in the sixth opening.

Particularly, first to third insulation layers may be sequentially formed on the capping pattern 650, the first insulating interlayer 530, and the first contact plug 675 to fill the sixth opening.

The first and second insulation layers may be planarized until an upper surface of the capping pattern 650, the upper surface of the first insulating interlayer 530, the upper surface of the first contact plug 675 to form first to third insulation patterns 680, 690 and 700.

Referring to FIGS. 22 to 24 again, processes substantially the same as or similar to those illustrated with reference to FIGS. 1 to 4 may be performed, so that a second insulating interlayer 720 may be formed on insulation pattern structure 710, the capping pattern 650 and the first contact plug 675, a seventh opening may be formed through the second insulating interlayer 720 and the capping pattern 650 to expose an upper surface of the gate electrode structure by an etching process, and the second contact plug 735 may be formed in the seventh opening.

During the etching process, a misalignment may occur and a portion of the upper surface of the insulation pattern structure 710 may also be exposed. Upper surfaces of the first and second insulation patterns 680 and 690 may be exposed, and an upper surface of the third insulation pattern 700 may not be exposed. In the etching process, the first insulation pattern 680 may be etched together and the upper surface of first insulation pattern 680 may be inclined, however, the second insulation pattern 690 may not be etched and the upper surface of second insulation pattern 690 may be flat. The upper surface of the third insulation pattern 700 may not be exposed by the etching process, and thus may stay flat.

The third contact plug 745 may be formed through the second insulating interlayer 720 to contact the upper surface of the first contact plug 675. The semiconductor device may be manufactured by the above processes.

Figure 38:
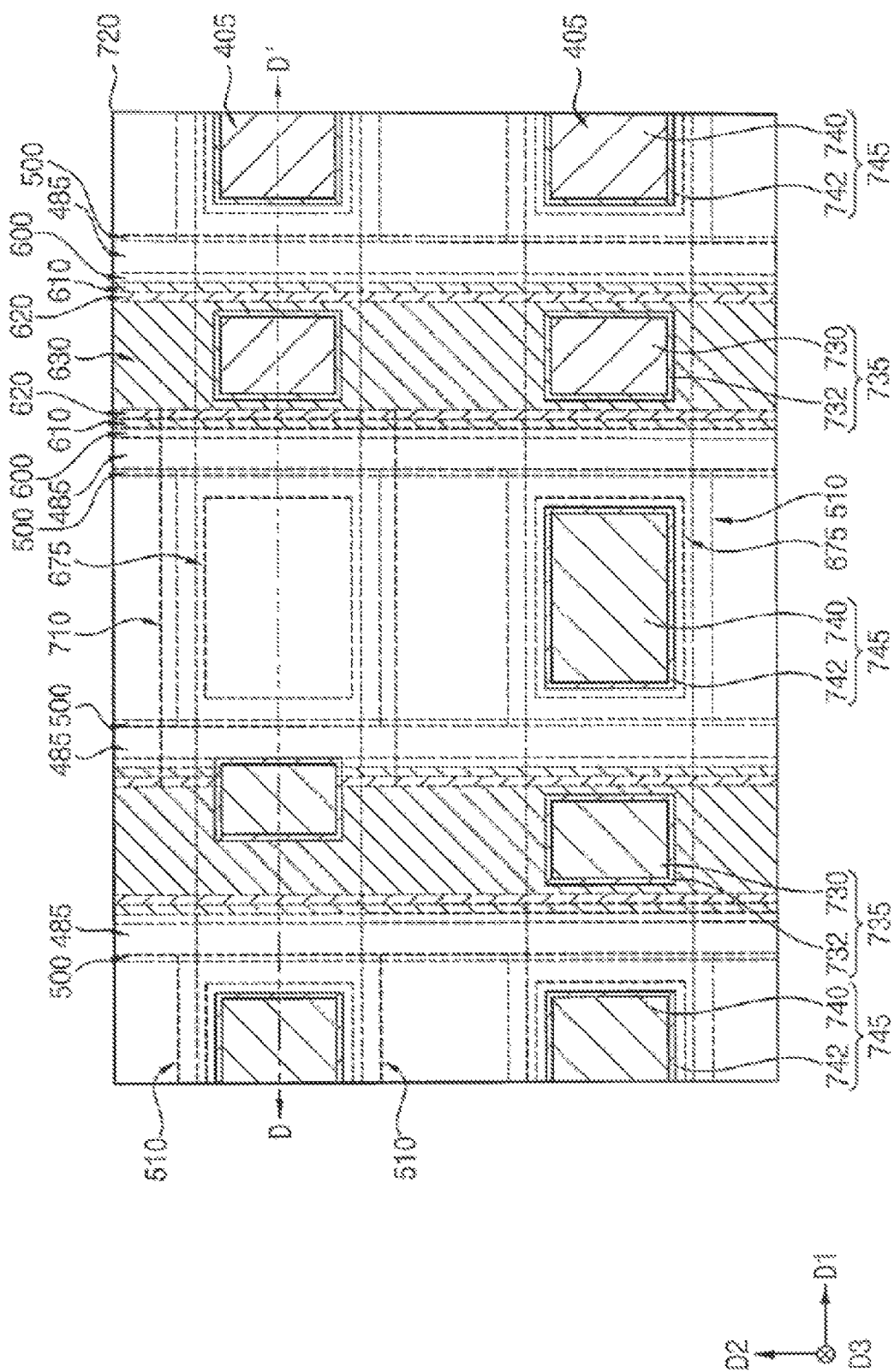
FIG. 38 is a plan view of a semiconductor device according to an embodiment.
Figure 39:
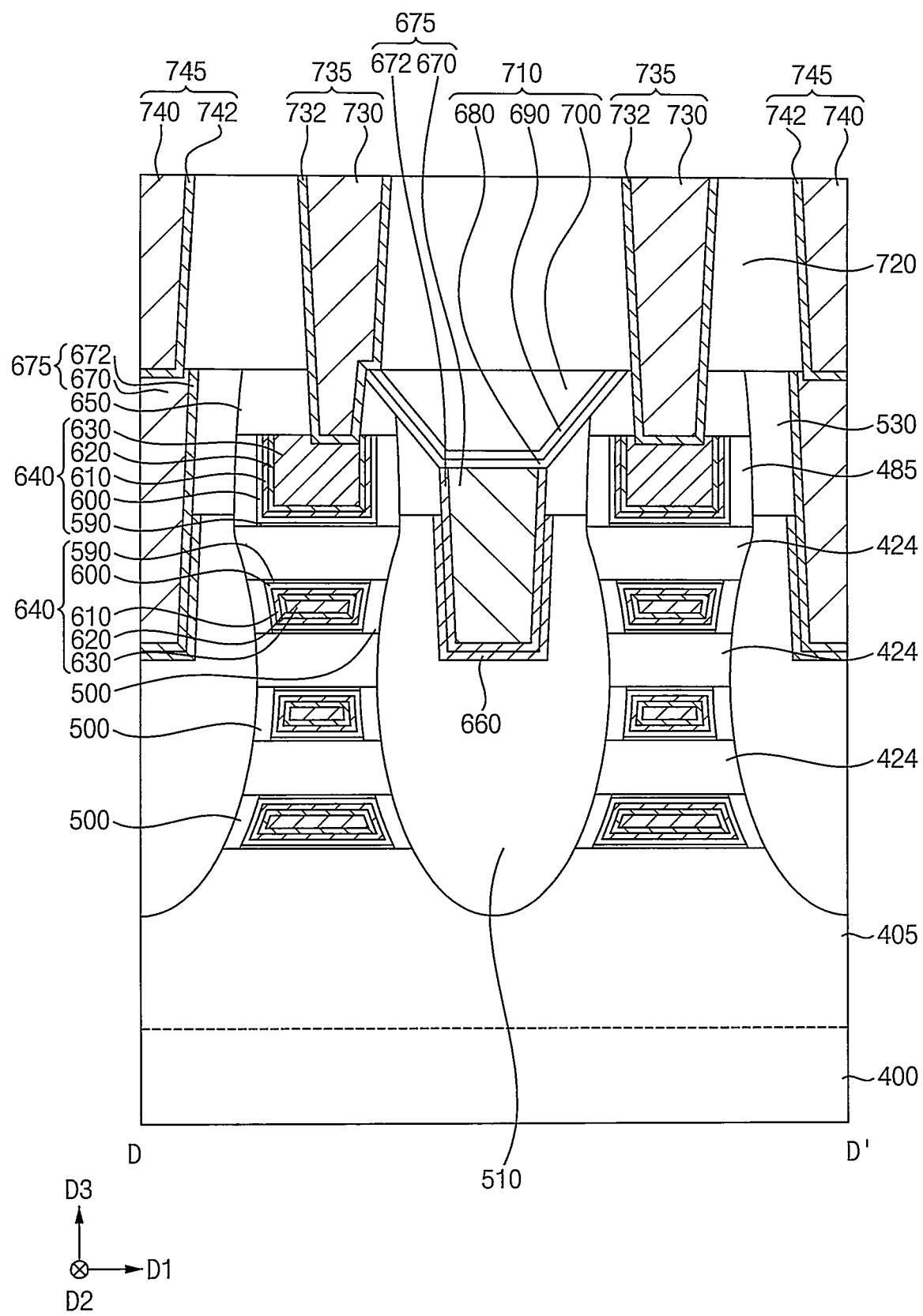
FIG. 39 is a cross-sectional view of a semiconductor device taken along a line D-D' in FIG. 38, according to an embodiment.

FIG. 38 is a plan view illustrating a semiconductor device according to an embodiment, and FIG. 39 is a cross-sectional view taken along a line D-D' of FIG. 38 according to an embodiment. This semiconductor device may include elements substantially the same as or similar to those of FIGS. 21 to 23, and thus detailed descriptions thereon are omitted herein.

Referring to FIGS. 38 and 39, the semiconductor device may further include an inner spacer 500 between the semiconductor patterns 424 to cover each of opposite sidewalls in the first direction of a lower portion of the gate structure 640.

The inner spacer 500 may include a nitride, e.g., silicon nitride.

Figure 40:
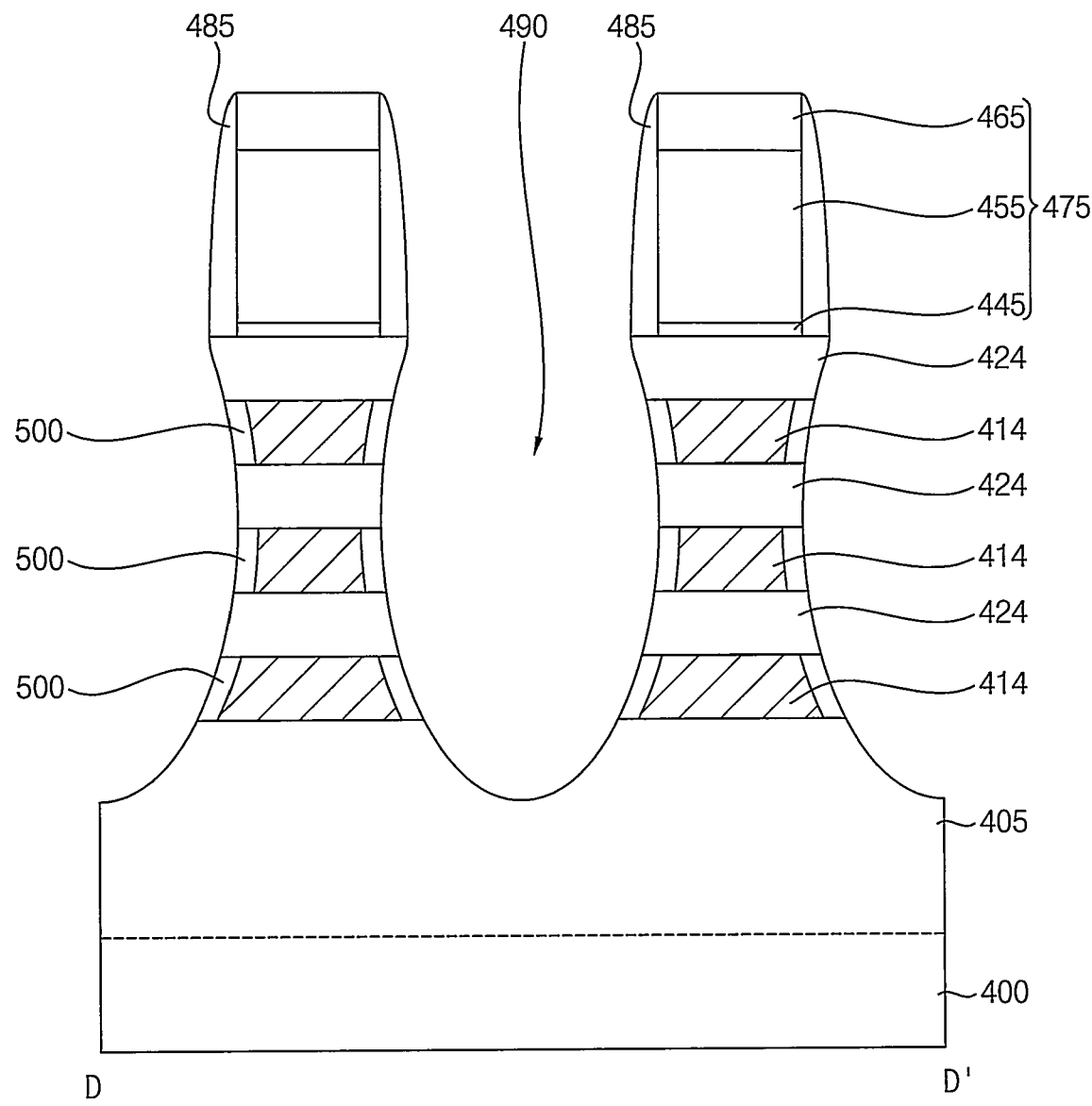

FIGS. 40 and 41 are cross-sectional views illustrating a method of manufacturing a semiconductor device in accordance with example embodiments. This method may include processes substantially the same as or similar to those illustrated with reference to FIGS. 22 to 37, and thus repeated descriptions thereon are omitted herein.

Referring to FIG. 40, a gap may be formed removing portions of each of the sacrificial patterns 414 adjacent to the third opening 490, and an inner spacer 500 may be formed to fill the gap.

Referring to FIG. 41, a SEG process may be performed using the semiconductor patterns 424 and the upper surface of the active pattern 405 exposed by the third opening 490 as a seed to form a source and drain layer 510 on an inner wall of the third opening 490, and a first insulating interlayer 530 may be formed on the substrate 400.

A fourth opening 540 (shown in FIG. 33) may be formed to expose an inner sidewall of the gate spacer 485 and an upper surface of an uppermost one of the semiconductor patterns 424, and a fifth opening 550 (shown in FIG. 33) may be formed to expose a sidewall of a portion of the source and drain layer 510, surfaces of the semiconductor patterns 424 and the upper surface of the active pattern 405.

A thermal oxidation process may be performed on the upper surface of the active pattern 405, the surfaces of the semiconductor patterns 424 and the sidewall of the source and drain layer 510 exposed by the fourth and fifth openings 540 and 550 to form an interface pattern 590, a gate insulation layer, a gate barrier layer and a first gate electrode layer may be sequentially and conformally formed on a surface of the interface pattern 590, an inner sidewall of the inner spacer 500, an inner sidewall and an upper surface of the gate spacer 485 and an upper surface of the first insulating interlayer 530, and a second gate electrode layer may be formed to fill remaining portions of the fourth and fifth openings 540 and 550.

In some embodiments, the interface pattern 590 may be formed by a CVD process, an ALD process, etc., instead of the thermal oxidation process, and may be also formed on the inner sidewall of the inner spacer 500 and the inner sidewall of the gate spacer 485.

The semiconductor device described with reference to FIGS. 38 and 39 may be manufactured by the above-described processes or operations.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A semiconductor device, comprising:
a gate structure disposed on a substrate;
a source and drain layer disposed on the substrate adjacent the gate structure;
a first contact plug disposed on the source and drain layer;
an insulation pattern structure disposed on the first contact plug, the insulation pattern structure including insulation patterns having different carbon concentrations; and
a second contact plug disposed on the gate structure,
wherein the insulation pattern structure comprises a first insulation pattern, a second insulation pattern, and a third insulation pattern sequentially stacked in a vertical direction substantially perpendicular to an upper surface of the substrate,
wherein the second contact plug is in contact with upper surfaces of the first insulation pattern and the second insulation pattern, and
wherein a dielectric constant of the second insulation pattern is greater than a dielectric constant of the first insulation pattern, based on a carbon concentration of the second insulation pattern being greater than a carbon concentration of the first insulation pattern.

2. The semiconductor device as claimed in claim 1, wherein the carbon concentration of the first insulation pattern is not smaller than a carbon concentration of the third insulation pattern.

3. The semiconductor device as claimed in claim 1, wherein a carbon concentration of each of the first insulation pattern and the third insulation pattern is greater than about 0 atom % and less than or equal to about 7 atom %, and
wherein the carbon concentration of the second insulation pattern is greater than or equal to about 10 atom % and less than or equal to about 15 atom %.

4. The semiconductor device as claimed in claim 1, wherein portions of surfaces of the first insulation pattern and the second insulation pattern are inclined, and
an upper surface of the third insulation pattern is flat.

5. The semiconductor device as claimed in claim 1, wherein each of the first insulation pattern, the second insulation pattern, and the third insulation pattern comprises silicon oxycarbide (SiOC), silicon carbonitride (SiCN), silicon oxycarbonitride (SiOCN), or silicon boroncarbonitride (SiBCN).

6. The semiconductor device as claimed in claim 1, wherein the second contact plug is in contact with an upper surface of the gate structure, and
wherein the semiconductor device further comprises a capping pattern disposed on a sidewall of a lower portion of the second contact plug and contacting the upper surface of the gate structure.

7. The semiconductor device as claimed in claim 6, wherein an upper surface of the capping pattern is at substantially the same height as an upper surface of the first contact plug.

8. The semiconductor device as claimed in claim 1, wherein an upper surface of the second contact plug is higher than an upper surface of the first contact plug.

9. A semiconductor device, comprising:
a plurality of channels disposed above a substrate and spaced apart from each other in a vertical direction substantially perpendicular to an upper surface of the substrate, each of the plurality of channels extending in a first direction substantially parallel to the upper surface of the substrate;
a gate structure disposed above the substrate and extending in a second direction substantially parallel to the upper surface of the substrate and intersecting the first direction, the gate structure disposed on lower and upper surfaces of each of the plurality of channels;
a source and drain layer disposed on the substrate adjacent to the gate structure, the source and drain layer being connected to each of opposite sidewalls of the plurality of channels in the first direction;
a first contact plug disposed on the source and drain layer;
an insulation pattern structure disposed on the first contact plug, the insulation pattern structure including insulation patterns having different carbon concentrations; and
a second contact plug disposed on the gate structure,
wherein the insulation pattern structure comprises a first insulation pattern, a second insulation pattern and a third insulation pattern sequentially stacked in the vertical direction, wherein the second contact plug is in contact with upper surfaces of the first insulation pattern and the second insulation pattern, and
wherein a dielectric constant of the second insulation pattern is greater than a dielectric constant of the first insulation pattern, based on a carbon concentration of the second insulation pattern being greater than a carbon concentration of the first insulation pattern.

10. The semiconductor device as claimed in claim 9, wherein the carbon concentration of the second insulation pattern is greater than a carbon concentration of the third insulation pattern.

11. The semiconductor device as claimed in claim 9, wherein the second contact plug is in contact with an upper surface of the gate structure, and
wherein the semiconductor device further comprises a capping pattern disposed on a sidewall of a lower portion of the second contact plug and contacting the upper surface of the gate structure.

12. A semiconductor device, comprising:
a gate structure disposed on a substrate;
a capping pattern disposed on the gate structure;
a source and drain layer disposed on the substrate adjacent the gate structure;
a first contact plug disposed on the source and drain layer;
an insulation pattern structure disposed on the first contact plug, the insulation pattern structure including a first insulation pattern, a second insulation pattern and a third insulation pattern sequentially stacked in a vertical direction substantially perpendicular to an upper surface of the substrate, and each of the first insulation pattern, the second insulation pattern and the third insulation pattern having different carbon concentrations; and a second contact plug disposed on the gate structure through the capping pattern, the second contact plug being connected to a portion of the insulation pattern structure, wherein a dielectric constant of the second insulation pattern is greater than a dielectric constant of the first insulation pattern, based on a carbon concentration of the second insulation pattern being greater than a carbon concentration of the first insulation pattern.

13. The semiconductor device as claimed in claim 12, wherein the carbon concentration of the second insulation pattern is greater than a carbon concentration of each of the first insulation pattern and the third insulation pattern.

14. The semiconductor device as claimed in claim 12, wherein an upper surface of the capping pattern is at substantially the same height as an upper surface of the first contact plug.

15. The semiconductor device as claimed in claim 12, wherein an upper surface of the second contact plug is higher than an upper surface of the first contact plug.

16. The semiconductor device as claimed in claim 1, wherein the first insulation pattern is a lowermost insulation pattern of the insulation pattern structure.

17. The semiconductor device as claimed in claim 9, wherein the first insulation pattern is a lowermost insulation pattern of the insulation pattern structure.

18. The semiconductor device as claimed in claim 12, wherein the first insulation pattern is a lowermost insulation pattern of the insulation pattern structure.

* * * * *